United States Patent
Lim et al.

(10) Patent No.: US 10,361,736 B2
(45) Date of Patent: Jul. 23, 2019

(54) METHOD FOR TRANSMITTING AND RECEIVING SIGNAL BY AGGREGATING TWO UPLINK CARRIERS

(71) Applicant: LG ELECTRONICS INC., Seoul (KR)

(72) Inventors: Suhwan Lim, Seoul (KR); Jaehyuk Jang, Seoul (KR); Sangwook Lee, Seoul (KR); Manyoung Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/934,713

(22) Filed: Mar. 23, 2018

(65) Prior Publication Data

US 2018/0278283 A1    Sep. 27, 2018

Related U.S. Application Data

(60) Provisional application No. 62/475,883, filed on Mar. 24, 2017, provisional application No. 62/490,618, (Continued)

(51) Int. Cl.
| | |
|---|---|
| *H03H 1/00* | (2006.01) |
| *H04B 1/04* | (2006.01) |
| *H04L 5/00* | (2006.01) |
| *H04L 5/14* | (2006.01) |
| *H04B 1/10* | (2006.01) |
| *H04B 1/14* | (2006.01) |
| *H04L 27/00* | (2006.01) |
| *H04B 1/00* | (2006.01) |

(52) U.S. Cl.
CPC ............. *H04B 1/1081* (2013.01); *H03H 1/00* (2013.01); *H04B 1/0053* (2013.01); *H04B 1/0475* (2013.01); *H04B 1/1027* (2013.01); *H04B 1/14* (2013.01); *H04L 5/001* (2013.01); *H04L 5/143* (2013.01); *H04L 27/0014* (2013.01); *H04L 5/0016* (2013.01); *H04L 2027/0051* (2013.01)

(58) Field of Classification Search
CPC combination set(s) only.
See application file for complete search history.

(56) References Cited

U.S. PATENT DOCUMENTS 9,001,948 B2 * 4/2015 Ramakrishnan ............................ H04L 25/03834 375/350
9,214,973 B1 * 12/2015 Venkatesh ............ H04B 1/1036
(Continued)

OTHER PUBLICATIONS

ETSI, LTE: E-UTRA User Equipment (UE) radio transmission and reception (3GPP TS 36.101 V13.3.0 Release 13), May 2016, https://www.etsi.org/deliver/etsi_ts/136100_136199/136101/13.02.01_60/ts_136101v130201p.pdf ( Year: 2016), pp. 1-893.*

*Primary Examiner* — Linda Wong
(74) *Attorney, Agent, or Firm* — Birch, Stewart, Kolasch & Birch, LLP

(57) ABSTRACT

When a terminal aggregates three downlink carriers by using the carrier aggregation (CA) of the LTE-A technology and transmits an uplink signal on two uplink carriers while aggregating at least two uplink carriers, a harmonic component and an intermodulation distortion (IMD) component are generated, thereby influencing a downlink band of the terminal itself. Therefore, the present specification presents a scheme therefor.

4 Claims, 13 Drawing Sheets

Related U.S. Application Data filed on Apr. 27, 2017, provisional application No. 62/544,043, filed on Aug. 11, 2017.

(56) References Cited

U.S. PATENT DOCUMENTS

| | | | |
|---|---|---|---|
| 2009/0023411 A1* | 1/2009 | Katsube | H04B 1/1018 455/307 |
| 2009/0054008 A1* | 2/2009 | Satou | H04B 1/406 455/78 |
| 2010/0311381 A1* | 12/2010 | Katsube | H04B 1/1018 455/307 |
| 2011/0211649 A1* | 9/2011 | Hahn | H04B 1/525 375/285 |
| 2011/0256899 A1* | 10/2011 | Khazei | H04B 15/00 455/517 |
| 2012/0257694 A1* | 10/2012 | Balakrishnan | H04B 1/1646 375/340 |
| 2013/0302041 A1* | 11/2013 | Matsui | H04B 10/6971 398/208 |
| 2014/0323071 A1* | 10/2014 | Liao | H04B 1/1036 455/183.1 |
| 2016/0329920 A1* | 11/2016 | Li | H04B 1/525 |
| 2016/0344100 A1* | 11/2016 | Onaka | H04B 1/525 |
| 2017/0054535 A1* | 2/2017 | Lim | H04B 1/525 |
| 2017/0187402 A1* | 6/2017 | Tsutsui | H04B 15/00 |
| 2017/0207812 A1* | 7/2017 | Wyville | H04L 5/14 |

\* cited by examiner

- Issue 1 : Harmonic problem into Band 47

- Issue 2: IMD problem into Band 47 : No impact to Band 47 receiving

- Issue 3: IMD problem into licensed Band

METHOD FOR TRANSMITTING AND RECEIVING SIGNAL BY AGGREGATING TWO UPLINK CARRIERS

CROSS-REFERENCE TO RELATED APPLICATIONS

This application claims the benefit of U.S. Provisional Application No. 62/475,883 filed on Mar. 24, 2017, No. 62/490,618 filed on Apr. 27, 2017 and No. 62/544,043 filed on Aug. 11, 2017, the contents of which are all hereby incorporated by reference herein in their entirety.

BACKGROUND OF THE INVENTION

Field of the Invention

The present invention relates to mobile communication.

Discussion of the Related Art $3^{rd}$ generation partnership project (3GPP) long term evolution (LTE) evolved from a universal mobile telecommunications system (UMTS) is introduced as the 3GPP release 8. The 3GPP LTE uses orthogonal frequency division multiple access (OFDMA) in a downlink, and uses single carrier-frequency division multiple access (SC-FDMA) in an uplink.

Development of 3GPP LTE-Advanced (LTE-A) which is an evolution of the 3GPP LTE has been completed in recent years. According to the LTE-A, a carrier aggregation (CA) technology is presented, which aggregates and uses multiple bands into one.

A frequency which can be used for LTE/LTE-A, that is, a carrier is defined in 3GPP by considering radio wave situations of various countries.

Meanwhile, when a terminal transmits an uplink signal on two uplink carriers while aggregating two uplink carriers, a harmonic component and an intermodulation distortion (IMD) component are generated, thereby influencing a uplink band of the terminal itself.

SUMMARY OF THE INVENTION

Accordingly, a disclosure of the present specification has been made in an effort to solve the aforementioned problem. the method for transmitting/receiving a signal by a terminal configured to aggregate a plurality of downlink carriers and two uplink carriers, the method comprises, receiving downlink signal through the downlink carriers by using value of maximum sensitivity degradation (MSD) for a reference sensitivity of the uplink carriers if the uplink carriers include evolved universal terrestrial radio access (E-UTRA) operating bands 20 and 47 and the downlink carriers include E-UTRA operating band 47, wherein the value of the MSD is predetermined according to whether a harmonic trap filter for mitigating harmonic interference is used to the terminal.

Herein if the harmonic trap filter is used to the terminal, the value of the MSD is 0.16 dB.

Herein if the harmonic trap filter is not used to the terminal, the value of the MSD is 5.08 dB.

In accordance with another embodiment of the present invention, provided is

A terminal configured to aggregate a plurality of downlink carriers and two uplink carriers for transmitting/receiving a signal. The terminal may comprise a transceiver configured to: transmit an uplink signal through the uplink carriers, the uplink carriers include evolved universal terrestrial radio access (E-UTRA) operating bands 20 and 47; receive a downlink signal through the downlink carriers by using value of maximum sensitivity degradation (MSD) for a reference sensitivity of the uplink carriers, the downlink carriers include E-UTRA operating band 47; and a processor configured to control the transceiver, wherein the value of the MSD is predetermined according to whether a harmonic trap filter for mitigating harmonic interference is used to the terminal.

According to a disclosure of the present invention, the above problem of the related art is solved.

DETAILED DESCRIPTION OF THE EMBODIMENTS

Figure 1:
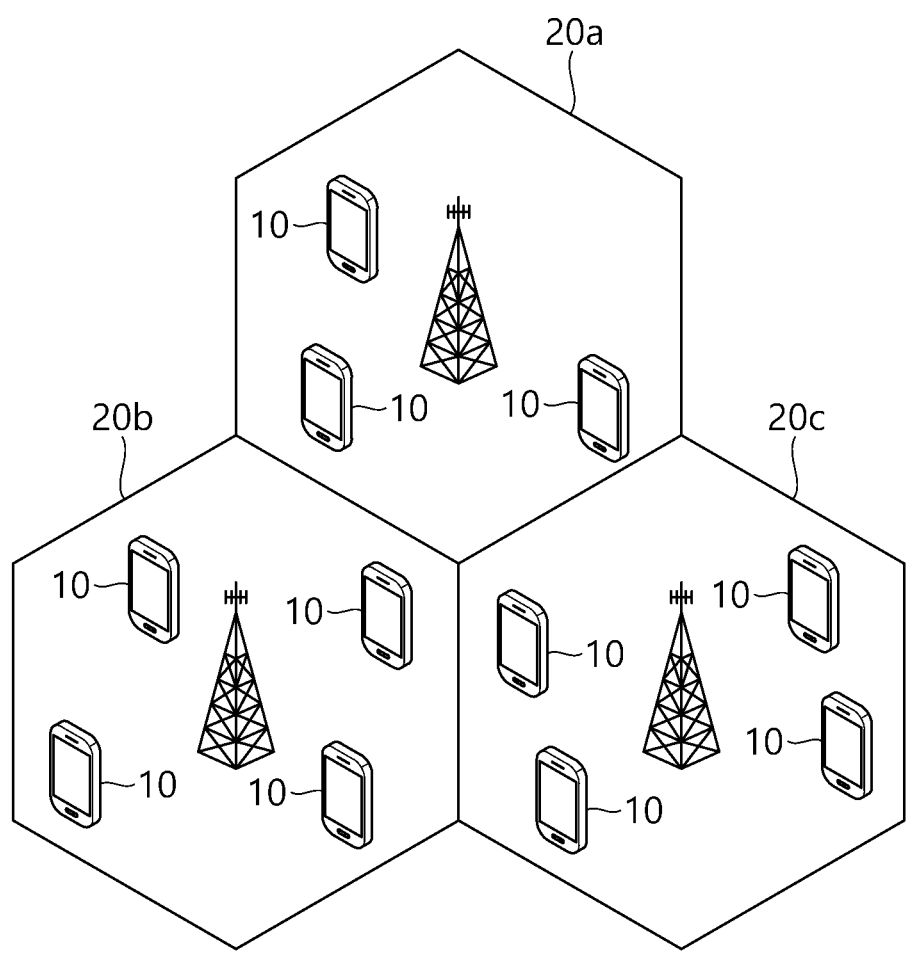
FIG. 1 illustrates a wireless communication system.

Hereinafter, based on 3rd Generation Partnership Project (3GPP) long term evolution (LTE) or 3GPP LTE-advanced (LTE-A), the present invention will be applied. This is just an example, and the present invention may be applied to various wireless communication systems. Hereinafter, LTE includes LTE and/or LTE-A.

The technical terms used herein are used to merely describe specific embodiments and should not be construed as limiting the present invention. Further, the technical terms used herein should be, unless defined otherwise, interpreted as having meanings generally understood by those skilled in the art but not too broadly or too narrowly. Further, the technical terms used herein, which are determined not to exactly represent the spirit of the invention, should be replaced by or understood by such technical terms as being able to be exactly understood by those skilled in the art. Further, the general terms used herein should be interpreted in the context as defined in the dictionary, but not in an excessively narrowed manner.

The expression of the singular number in the specification includes the meaning of the plural number unless the meaning of the singular number is definitely different from that of the plural number in the context. In the following description, the term 'include' or 'have' may represent the existence of a feature, a number, a step, an operation, a component, a part or the combination thereof described in the specification, and may not exclude the existence or addition of another feature, another number, another step, another operation, another component, another part or the combination thereof.

The terms 'first' and 'second' are used for the purpose of explanation about various components, and the components are not limited to the terms 'first' and 'second'. The terms 'first' and 'second' are only used to distinguish one component from another component. For example, a first component may be named as a second component without deviating from the scope of the present invention.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present.

Hereinafter, exemplary embodiments of the present invention will be described in greater detail with reference to the accompanying drawings. In describing the present invention, for ease of understanding, the same reference numerals are used to denote the same components throughout the drawings, and repetitive description on the same components will be omitted. Detailed description on well-known arts which are determined to make the gist of the invention unclear will be omitted. The accompanying drawings are provided to merely make the spirit of the invention readily understood, but not should be intended to be limiting of the invention. It should be understood that the spirit of the invention may be expanded to its modifications, replacements or equivalents in addition to what is shown in the drawings.

As used herein, 'base station' generally refers to a fixed station that communicates with a wireless device and may be denoted by other terms such as eNB (evolved-NodeB), BTS (base transceiver system), or access point.

As used herein, user equipment (UE) may be stationary or mobile, and may be denoted by other terms such as device, wireless device, terminal, MS (mobile station), UT (user terminal), SS (subscriber station), MT (mobile terminal) and etc.

FIG. 1 Illustrates a Wireless Communication System.

Referring to FIG. 1, the wireless communication system includes at least one base station (BS) 20. Respective BSs 20 provide a communication service to particular geographical areas 20a, 20b, and 20c (which are generally called cells).

The UE generally belongs to one cell and the cell to which the terminal belong is referred to as a serving cell. A base station that provides the communication service to the serving cell is referred to as a serving BS. Since the wireless communication system is a cellular system, another cell that neighbors to the serving cell is present. Another cell which neighbors to the serving cell is referred to a neighbor cell. A base station that provides the communication service to the neighbor cell is referred to as a neighbor BS. The serving cell and the neighbor cell are relatively decided based on the UE.

Hereinafter, a downlink means communication from the base station 20 to the terminal 10 and an uplink means communication from the terminal 10 to the base station 20. In the downlink, a transmitter may be a part of the base station 20 and a receiver may be a part of the terminal 10. In the uplink, the transmitter may be a part of the terminal 10 and the receiver may be a part of the base station 20.

Hereinafter, the LTE system will be described in detail.

Figure 2:
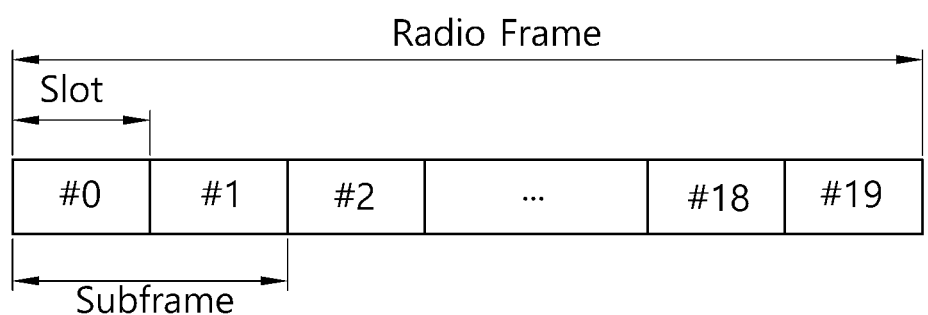
FIG. 2 illustrates the architecture of a radio frame according to frequency division duplex (FDD) of 3rd generation partnership project (3GPP) long term evolution (LTE).

FIG. 2 Shows a Downlink Radio Frame Structure According to FDD of 3rd Generation Partnership Project (3GPP) Long Term Evolution (LTE).

The radio frame of FIG. 2 may be found in the section 5 of 3GPP TS 36.211 V10.4.0 (2011-12) "Evolved Universal Terrestrial Radio Access (E-UTRA); Physical Channels and Modulation (Release 10)".

Referring to FIG. 2, the radio frame consists of 10 subframes. One subframe consists of two slots. Slots included in the radio frame are numbered with slot numbers 0 to 19. A time required to transmit one subframe is defined as a transmission time interval (TTI). The TTI may be a scheduling unit for data transmission. For example, one radio frame may have a length of 10 milliseconds (ms), one subframe may have a length of 1 ms, and one slot may have a length of 0.5 ms.

The structure of the radio frame is for exemplary purposes only, and thus the number of subframes included in the radio frame or the number of slots included in the subframe may change variously.

Meanwhile, one slot may include a plurality of OFDM symbols. The number of OFDM symbols included in one slot may vary depending on a cyclic prefix (CP).

Figure 3:
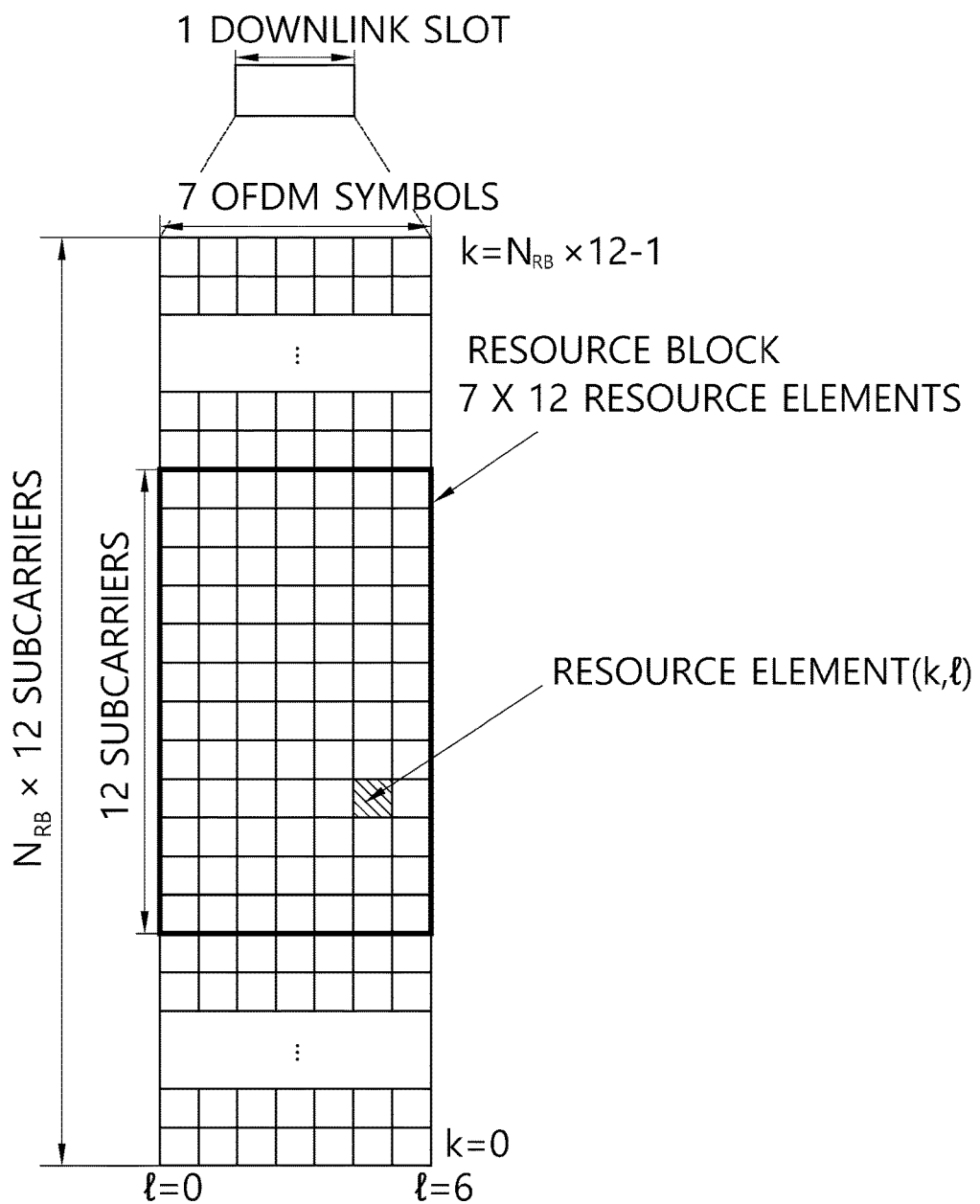
FIG. 3 illustrates an example resource grid for one uplink or downlink slot in 3GPP LTE.

FIG. 3 Illustrates an Example Resource Grid for One Uplink or Downlink Slot in 3Gpp Lte.

Referring to FIG. 3, the uplink slot includes a plurality of OFDM (orthogonal frequency division multiplexing) symbols in the time domain and NRB resource blocks (RBs) in the frequency domain. For example, in the LTE system, the number of resource blocks (RBs), i.e., NRB, may be one from 6 to 110.

Resource block (RB) is a resource allocation unit and includes a plurality of sub-carriers in one slot. For example, if one slot includes seven OFDM symbols in the time domain and the resource block includes 12 sub-carriers in the frequency domain, one resource block may include 7×12 resource elements (REs).

Meanwhile, the number of sub-carriers in one OFDM symbol may be one of 128, 256, 512, 1024, 1536, and 2048.

Figure 4:
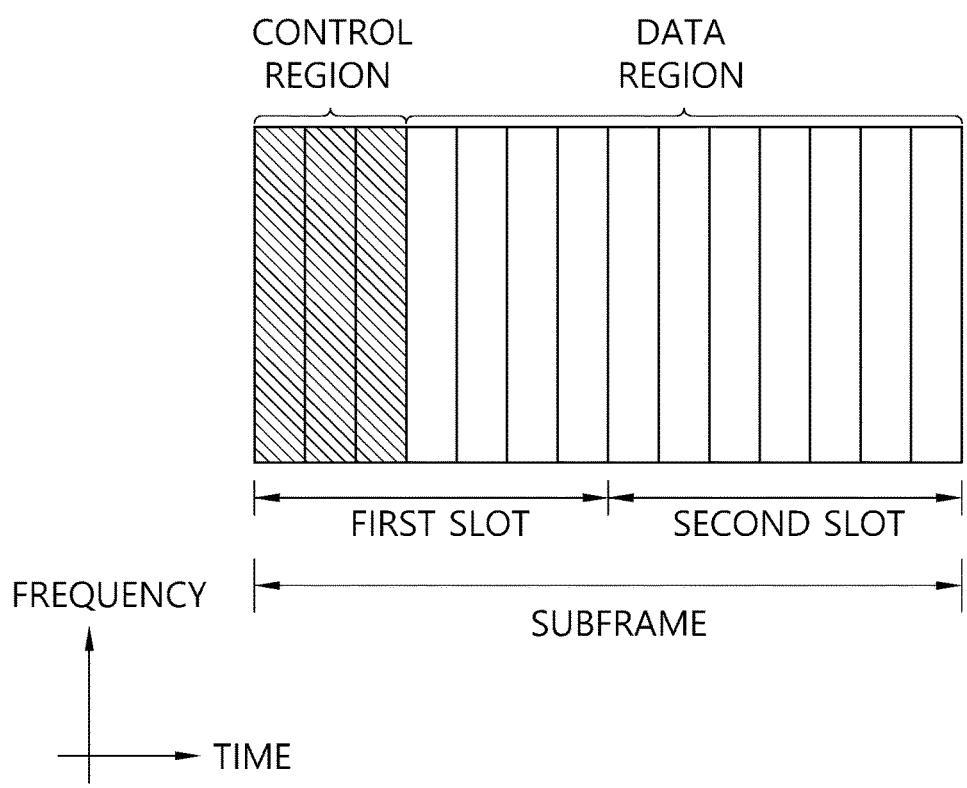
FIG. 4 illustrates the architecture of a downlink subframe.

In 3GPP LTE, the resource grid for one uplink slot shown in FIG. 4 may also apply to the resource grid for the downlink slot.

FIG. 4 Illustrates the Architecture of a Downlink Sub-Frame.

In FIG. 4, assuming the normal CP, one slot includes seven OFDM symbols, by way of example.

The DL (downlink) sub-frame is split into a control region and a data region in the time domain. The control region includes up to first three OFDM symbols in the first slot of the sub-frame. However, the number of OFDM symbols included in the control region may be changed. A PDCCH (physical downlink control channel) and other control channels are allocated to the control region, and a PDSCH is allocated to the data region.

The physical channels in 3GPP LTE may be classified into data channels such as PDSCH (physical downlink shared channel) and PUSCH (physical uplink shared channel) and control channels such as PDCCH (physical downlink control channel), PCFICH (physical control format indicator channel), PHICH (physical hybrid-ARQ indicator channel) and PUCCH (physical uplink control channel).

The PCFICH transmitted in the first OFDM symbol of the sub-frame carries CIF (control format indicator) regarding the number (i.e., size of the control region) of OFDM symbols used for transmission of control channels in the sub-frame. The wireless device first receives the CIF on the PCFICH and then monitors the PDCCH.

Unlike the PDCCH, the PCFICH is transmitted through a fixed PCFICH resource in the sub-frame without using blind decoding. The PHICH carries an ACK (positive-acknowledgement)/NACK (negative-acknowledgement) signal for a UL HARQ (hybrid automatic repeat request). The ACK/NACK signal for UL (uplink) data on the PUSCH transmitted by the wireless device is sent on the PHICH.

The PBCH (physical broadcast channel) is transmitted in the first four OFDM symbols in the second slot of the first sub-frame of the radio frame. The PBCH carries system information necessary for the wireless device to communicate with the base station, and the system information transmitted through the PBCH is denoted MIB (master information block). In comparison, system information transmitted on the PDSCH indicated by the PDCCH is denoted SIB (system information block).

The PDCCH may carry activation of VoIP (voice over internet protocol) and a set of transmission power control commands for individual UEs in some UE group, resource allocation of an upper layer control message such as a random access response transmitted on the PDSCH, system information on DL-SCH, paging information on PCH, resource allocation information of UL-SCH (uplink shared channel), and resource allocation and transmission format of DL-SCH (downlink-shared channel). A plurality of PDCCHs may be sent in the control region, and the terminal may monitor the plurality of PDCCHs. The PDCCH is transmitted on one CCE (control channel element) or aggregation of some consecutive CCEs. The CCE is a logical allocation unit used for providing a coding rate per radio channel's state to the PDCCH. The CCE corresponds to a plurality of resource element groups. Depending on the relationship between the number of CCEs and coding rates provided by the CCEs, the format of the PDCCH and the possible number of PDCCHs are determined.

The control information transmitted through the PDCCH is denoted downlink control information (DCI). The DCI may include resource allocation of PDSCH (this is also referred to as DL (downlink) grant), resource allocation of PUSCH (this is also referred to as UL (uplink) grant), a set of transmission power control commands for individual UEs in some UE group, and/or activation of VoIP (Voice over Internet Protocol).

The base station determines a PDCCH format according to the DCI to be sent to the terminal and adds a CRC (cyclic redundancy check) to control information. The CRC is masked with a unique identifier (RNTI; radio network temporary identifier) depending on the owner or purpose of the PDCCH. In case the PDCCH is for a specific terminal, the terminal's unique identifier, such as C-RNTI (cell-RNTI), may be masked to the CRC. Or, if the PDCCH is for a paging message, a paging indicator, for example, P-RNTI (paging-RNTI) may be masked to the CRC. If the PDCCH is for a system information block (SIB), a system information identifier, SI-RNTI (system infothiation-RNTI), may be masked to the CRC. In order to indicate a random access response that is a response to the terminal's transmission of a random access preamble, an RA-RNTI (random access-RNTI) may be masked to the CRC.

In 3GPP LTE, blind decoding is used for detecting a PDCCH. The blind decoding is a scheme of identifying whether a PDCCH is its own control channel by demasking a desired identifier to the CRC (cyclic redundancy check) of a received PDCCH (this is referred to as candidate PDCCH) and checking a CRC error. The base station determines a PDCCH format according to the DCI to be sent to the wireless device, then adds a CRC to the DCI, and masks a unique identifier (this is referred to as RNTI (radio network temporary identifier) to the CRC depending on the owner or purpose of the PDCCH.

The uplink channels include a PUSCH, a PUCCH, an SRS (Sounding Reference Signal), and a PRACH (physical random access channel).

Figure 5:
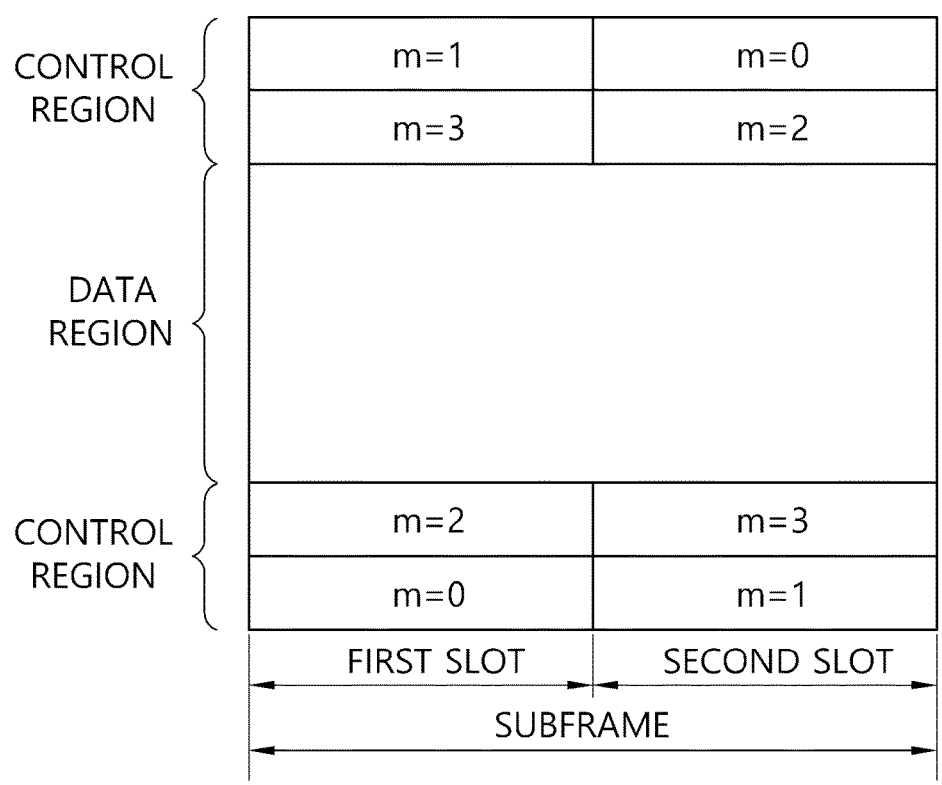
FIG. 5 illustrates the architecture of an uplink subframe in 3GPP LTE.

FIG. 5 Illustrates the Architecture of an Uplink Sub-Frame in 3GPP LTE.

Referring to FIG. 5, the uplink sub-frame may be separated into a control region and a data region in the frequency domain. The control region is assigned a PUCCH (physical uplink control channel) for transmission of uplink control information. The data region is assigned a PUSCH (physical uplink shared channel) for transmission of data (in some cases, control information may also be transmitted).

The PUCCH for one terminal is assigned in resource block (RB) pair in the sub-frame. The resource blocks in the resource block pair take up different sub-carriers in each of the first and second slots. The frequency occupied by the resource blocks in the resource block pair assigned to the PUCCH is varied with respect to a slot boundary. This is referred to as the RB pair assigned to the PUCCH having been frequency-hopped at the slot boundary.

The terminal may obtain a frequency diversity gain by transmitting uplink control information through different sub-carriers over time. m is a location index that indicates a logical frequency domain location of a resource block pair assigned to the PUCCH in the sub-frame.

The uplink control information transmitted on the PUCCH includes an HARQ (hybrid automatic repeat request), an ACK (acknowledgement)/NACK (non-acknowledgement), a CQI (channel quality indicator) indicating a downlink channel state, and an SR (scheduling request) that is an uplink radio resource allocation request.

The PUSCH is mapped with a UL-SCH that is a transport channel. The uplink data transmitted on the PUSCH may be a transport block that is a data block for the UL-SCH transmitted for the TTI. The transport block may be user information. Or, the uplink data may be multiplexed data. The multiplexed data may be data obtained by multiplexing the transport block for the UL-SCH and control information. For example, the control information multiplexed with the data may include a CQI, a PMI (precoding matrix indicator), an HARQ, and an RI (rank indicator). Or, the uplink data may consist only of control information.

<Carrier Aggregation: CA>

Hereinafter, a carrier aggregation system will be described.

The carrier aggregation (CA) system means aggregating multiple component carriers (CCs). By the carrier aggregation, the existing meaning of the cell is changed. According to the carrier aggregation, the cell may mean a combination of a downlink component carrier and an uplink component carrier or a single downlink component carrier.

Further, in the carrier aggregation, the cell may be divided into a primary cell, secondary cell, and a serving cell. The primary cell means a cell that operates at a primary frequency and means a cell in which the UE performs an initial connection establishment procedure or a connection reestablishment procedure with the base station or a cell indicated by the primary cell during a handover procedure. The secondary cell means a cell that operates at a secondary frequency and once an RRC connection is established, the secondary cell is configured and is used to provide an additional radio resource.

The carrier aggregation system may be divided into a continuous carrier aggregation system in which aggregated carriers are contiguous and a non-contiguous carrier aggregation system in which the aggregated carriers are separated from each other. Hereinafter, when the contiguous and non-contiguous carrier systems are just called the carrier aggregation system, it should be construed that the carrier aggregation system includes both a case in which the component carriers are contiguous and a case in which the component carriers are non-contiguous. The number of component carriers aggregated between the downlink and the uplink may be differently set. A case in which the number of downlink CCs and the number of uplink CCs are the same as each other is referred to as symmetric aggregation and a case in which the number of downlink CCs and the number of uplink CCs are different from each other is referred to as asymmetric aggregation.

Meanwhile, the carrier aggregation (CA) technologies, as described above, may be generally separated into an inter-band CA technology and an intra-band CA technology. The inter-band CA is a method that aggregates and uses CCs that are present in different bands from each other, and the intra-band CA is a method that aggregates and uses CCs in the same frequency band. Further, CA technologies are more specifically split into intra-band contiguous CA, intra-band non-contiguous CA, and inter-band non-contiguous CA.

Figure 6A:
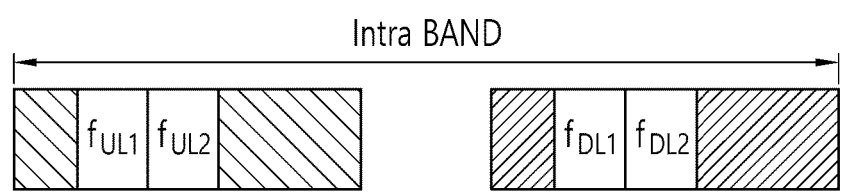
FIGS. 6A and 6B are conceptual views illustrating intra-band carrier aggregation (CA).
Figure 6B:
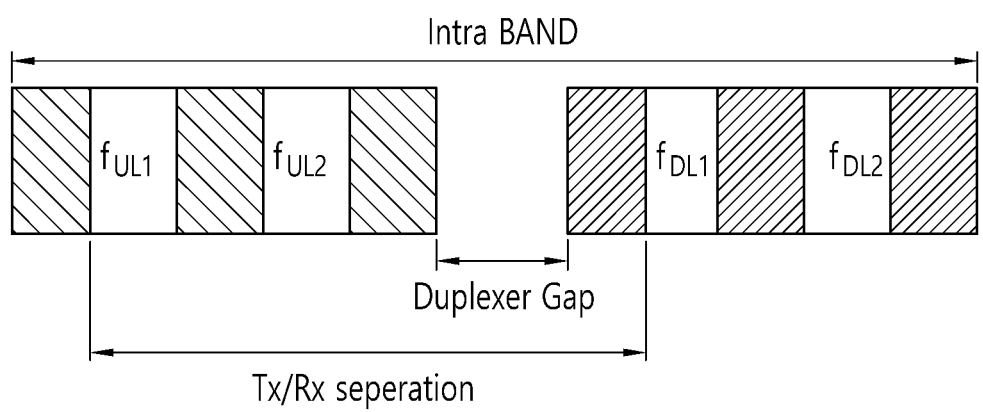

FIGS. 6A and 6B are Concept Views Illustrating Intra-Band Carrier aggregation (CA).

FIG. 6A illustrates intra-band contiguous CA, and FIG. 6B illustrates intra-band non-contiguous CA.

LTE-advanced adds various schemes including uplink MIMO and carrier aggregation in order to realize high-speed wireless transmission. The CA that is being discussed in LTE-advanced may be split into the intra-band contiguous CA shown in FIG. 6A and the intra-band non-contiguous CA shown in FIG. 6B.

Figure 7A:
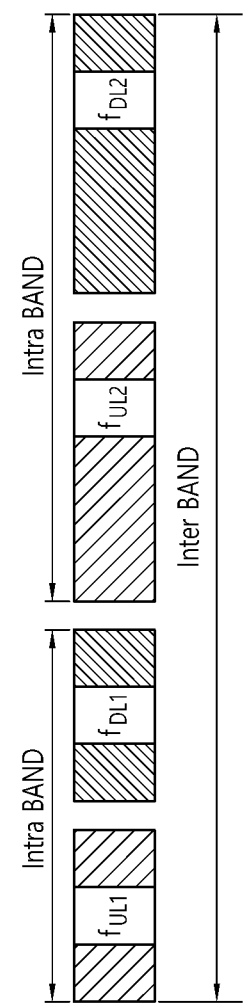
FIGS. 7A and 7B are conceptual views illustrating inter-band carrier aggregation (CA).
Figure 7B:
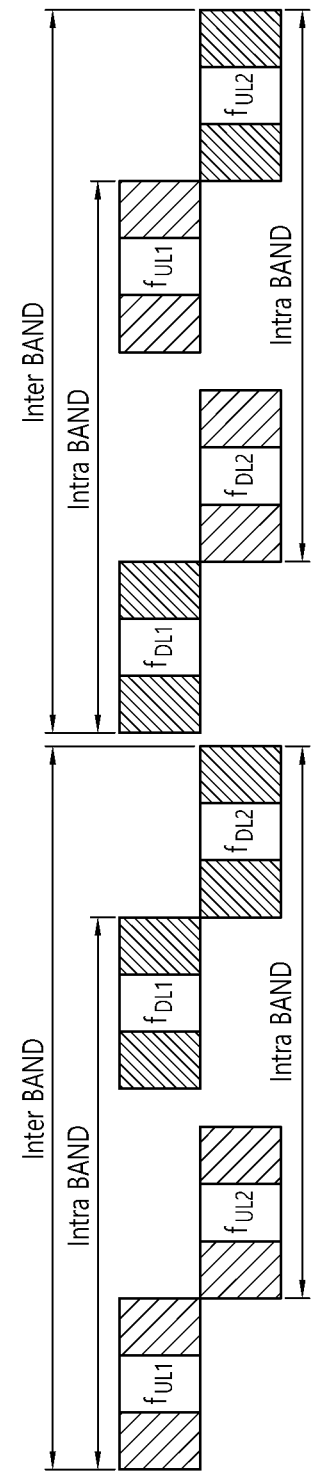

FIGS. 7A and 7B are Concept Views Illustrating Inter-Band Carrier Aggregation.

FIG. 7A illustrates a combination of a lower band and a higher band for inter-band CA, and FIG. 7B illustrates a combination of similar frequency bands for inter-band CA.

In other words, the inter-band carrier aggregation may be separated into inter-band CA between carriers of a low band and a high band having different RF characteristics of inter-band CA as shown in FIG. 7A and inter-band CA of similar frequencies that may use a common RF terminal per component carrier due to similar RF (radio frequency) characteristics as shown in FIG. 7B.

TABLE 1

| Operating Band | Uplink (UL) operating band $F_{UL\_low}$-$F_{UL\_high}$ | Downlink (DL) operating band $F_{DL\_low}$-$F_{DL\_high}$ | Duplex Mode |
|---|---|---|---|
| 1 | 1920 MHz-1980 MHz | 2110 MHz-2170 MHz | FDD |
| 2 | 1850 MHz-1910 MHz | 1930 MHz-1990 MHz | FDD |
| 3 | 1710 MHz-1785 MHz | 1805 MHz-1880 MHz | FDD |
| 4 | 1710 MHz-1755 MHz | 2110 MHz-2155 MHz | FDD |
| 5 | 824 MHz-849 MHz | 869 MHz-894 MHz | FDD |
| 6 | 830 MHz-840 MHz | 875 MHz-885 MHz | FDD |
| 7 | 2500 MHz-2570 MHz | 2620 MHz-2690 MHz | FDD |
| 8 | 880 MHz-915 MHz | 925 MHz-960 MHz | FDD |
| 9 | 1749.9 MHz-1784.9 MHz | 1844.9 MHz-1879.9 MHz | FDD |
| 10 | 1710 MHz-1770 MHz | 2110 MHz-2170 MHz | FDD |
| 11 | 1427.9 MHz-1447.9 MHz | 1475.9 MHz-1495.9 MHz | FDD |
| 12 | 699 MHz-716 MHz | 729 MHz-746 MHz | FDD |
| 13 | 777 MHz-787 MHz | 746 MHz-756 MHz | FDD |
| 14 | 788 MHz-798 MHz | 758 MHz-768 MHz | FDD |
| 15 | Reserved | Reserved | FDD |
| 16 | Reserved | Reserved | FDD |
| 17 | 704 MHz-716 MHz | 734 MHz-746 MHz | FDD |
| 18 | 815 MHz-830 MHz | 860 MHz-875 MHz | FDD |
| 19 | 830 MHz-845 MHz | 875 MHz-890 MHz | FDD |
| 20 | 832 MHz-862 MHz | 791 MHz-821 MHz | FDD |
| 21 | 1447.9 MHz-1462.9 MHz | 1495.9 MHz-1510.9 MHz | FDD |
| 22 | 3410 MHz-3490 MHz | 3510 MHz-3590 MHz | FDD |
| 23 | 2000 MHz-2020 MHz | 2180 MHz-2200 MHz | FDD |
| 24 | 1626.5 MHz-1660.5 MHz | 1525 MHz-1559 MHz | FDD |
| 25 | 1850 MHz-1915 MHz | 1930 MHz-1995 MHz | FDD |
| 26 | 814 MHz-849 MHz | 859 MHz-894 MHz | FDD |
| 27 | 807 MHz-824 MHz | 852 MHz-869 MHz | FDD |
| 28 | 703 MHz-748 MHz | 758 MHz-803 MHz | FDD |
| 29 | N/A N/A | 717 MHz-728 MHz | FDD |
| 30 | 2305 MHz-2315 MHz | 2350 MHz-2360 MHz | FDD |
| 31 | 452.5 MHz-457.5 MHz | 462.5 MHz-467.5 MHz | FDD |
| 32 | N/A N/A | 1452 MHz-1496 MHz | FDD |
| ... | | | |
| 33 | 1900 MHz-1920 MHz | 1900 MHz-1920 MHz | TDD |
| 34 | 2010 MHz-2025 MHz | 2010 MHz-2025 MHz | TDD |
| 35 | 1850 MHz-1910 MHz | 1850 MHz-1910 MHz | TDD |
| 36 | 1930 MHz-1990 MHz | 1930 MHz-1990 MHz | TDD |
| 37 | 1910 MHz-1930 MHz | 1910 MHz-1930 MHz | TDD |
| 38 | 2570 MHz-2620 MHz | 2570 MHz-2620 MHz | TDD |
| 39 | 1880 MHz-1920 MHz | 1880 MHz-1920 MHz | TDD |
| 40 | 2300 MHz-2400 MHz | 2300 MHz-2400 MHz | TDD |
| 41 | 2496 MHz 2690 MHz | 2496 MHz 2690 MHz | TDD |
| 42 | 3400 MHz-3600 MHz | 3400 MHz-3600 MHz | TDD |
| 43 | 3600 MHz-3800 MHz | 3600 MHz-3800 MHz | TDD |
| 44 | 703 MHz-803 MHz | 703 MHz-803 MHz | TDD |

When the operating bands are defined as shown in Table 1, each nation's frequency distributing organization may assign specific frequencies to service providers in compliance with the nation's circumstances.

Meanwhile, up to now, in a situation in which a maximum of two downlink carriers are aggregated required MPR and A-MPR, and the like have been researched.

However, a situation in which three of more downlink carriers and two uplink carriers are aggregated has not researched up to now. Therefore, hereinafter, the situation will be proposed.

Figure 8:
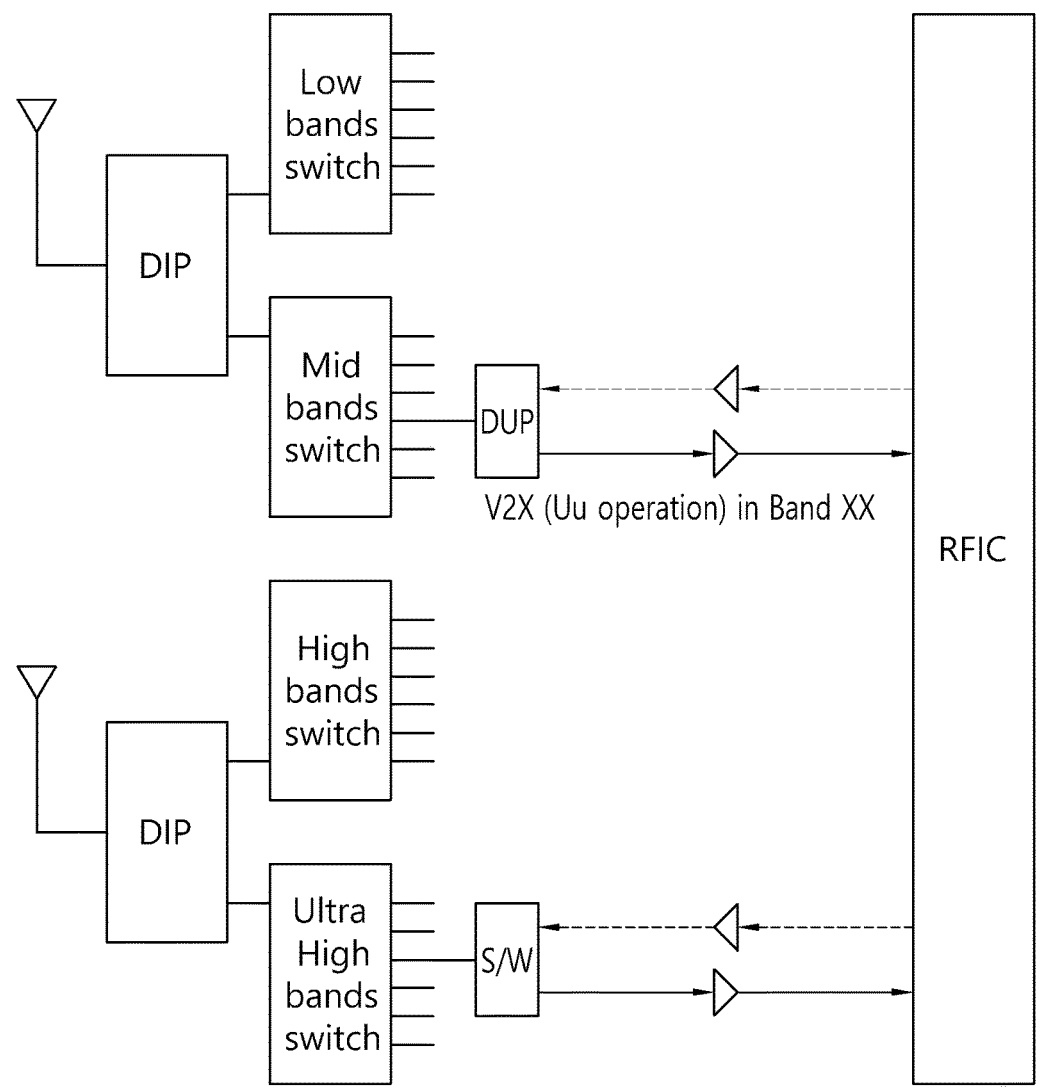
FIG. 8 is an example RF architecture of inter-band con-current operation.

FIG. 8 is an Example RF Architecture of Inter-Band Con-Current Operation.

For LTE-based V2X service in Rel-14, RAN4 considered example RF architecture as shown in FIG. 8. In RAN4 only added V2X band combination without harmonics/IMDs problem to own V2X received frequency bands based on the agreed WF in rel-14 as below.

Agreed WF: For introducing new license bands for V2X operation, RAN4 agreed the follow phased approach.

Due to time limitation to complete at March 2017 in rel-14, the phased approach proposed to add new licensed bands as below. 1st phase, Add new licensed bands w/o harmonics/IMD problems into Band 47. So Band 3/7/8/39/41 are added for the new inter-band con-current V2X operation in V2X WI. 2nd phase, RAN4 study how to solve the harmonics/IMDs problems of multi-carrier V2X band combination.

Hence, RAN4 need to study how to solve the harmonics/IMD problem into the own receiving frequency bands for inter-band con-current V2X operation.

Table 2 shows the harmonics and IMDs problem by legacy LTE UL transmission or dual transmission with licensed band and unlicensed band. Based on the analysis Table 2, we summary the coexistence problem to own V2X Rx bands as below.

TABLE 2

| Licensed Band | | | B47 Range (MHz) 5855-5925 Harmonic | Comments for harmonics/ |
|---|---|---|---|---|
| E-UTRA band | UL Range (MHz) | Harm. Order | Range (MHz) | IMD problems |
| B3 | 1710-1785 | 3x | 5130-5355 | No Harmonics/IMDs |
| B7 | 2500-2570 | 2x | 5000-5140 | No Harmonics/IMDs |
| B8 | 880-915 | 6x | 5280-5490 | No Harmonics/IMDs |
| B39 | 1880-1920 | 3x | 5640-5760 | No Harmonics/IMDs |
| B41 | 2496-2690 | 2x | 4992-5380 | No Harmonics/IMDs |
| B1 | 1920-1980 | 3x | 5760-5940 | 1) Harmonic into B47 2) $5^{th}$ IMD into B47 |
| B5 | 824-849 | 7x | 5768-5943 | 1) Harmonic into B47, No IMD problems |
| B19 | 830-845 | 7x | 5810-5915 | 1) Harmonic into B47 No IMD problems |
| B20 | 832-862 | 7x | 5824-6034 | 1) Harmonic into B47, No IMD problems |
| B21 | 1448-1463 | 4x | 5792-5852 | 1) Side-lobe into B47 2) $4^{th}$ IMD into B21 |
| B26 | 814-849 | 7x | 5698-5943 | 1) Harmonic into B47 No IMD problems |
| B28 | 703-748 | 8x | 5624-5984 | 1) Harmonic into B47 No IMD problems |
| B31 | 452.5-457.5 | 13x | 5882.5-5947.5 | 1) Harmonic into B47 but $13^{th}$ harmonic impact can ignore. No IMD problems |

TABLE 2-continued

| Licensed Band | | | B47 Range (MHz) 5855-5925 Harmonic | Comments for harmonics/ |
|---|---|---|---|---|
| E-UTRA band | UL Range (MHz) | Harm. Order | Range (MHz) | IMD problems |
| B65 | 1920-2010 | 3x | 5760-6030 | 1) Harmonic into B47 2) $5^{th}$ IMD into B47 and B65 |
| The other Licensed bands | — | Xx | — | No Harmonic impact. But need to IMD analysis into Band 47 and own licensed operating bands |

Issue 1: Harmonics problem into Band 47
Issue 2: IMD problem into Band 47→Not occurred issues
Issue 3: IMD problem into licensed band (Band 21, Band 65)

Figure 9:
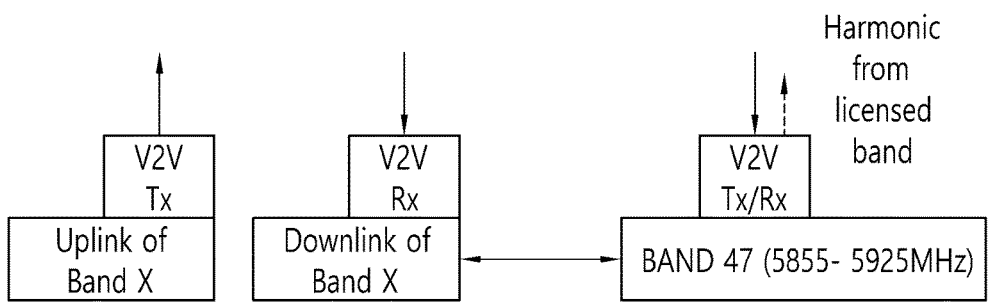
FIG. 9 illustrates harmonic/IMD problems for inter-band con-current V2X operation.
Figure 9:
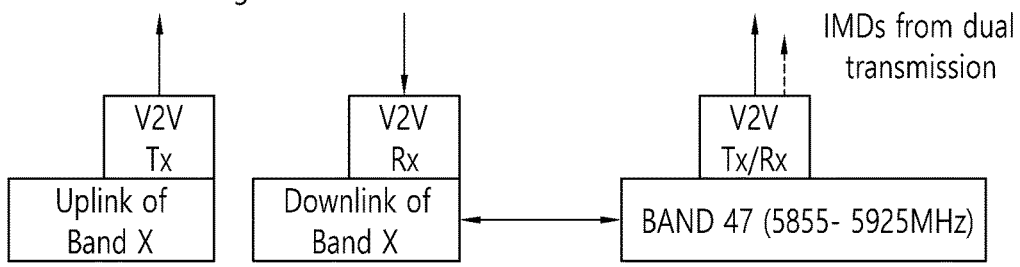
Figure 9:
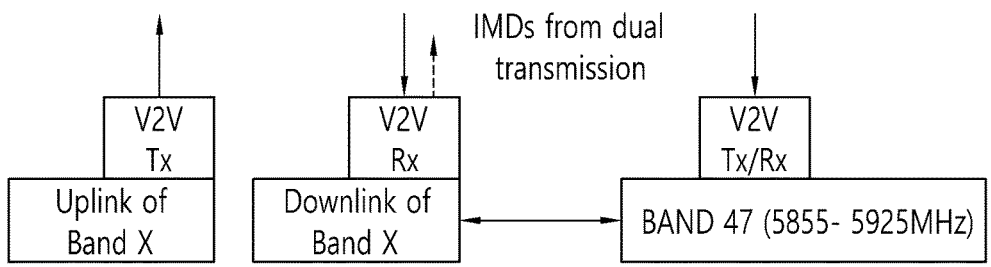

However, the issue 2 is not occurred for inter-band con-current V2X UE including Band 47. Since Band 47 could not receive signal during Band 47 sidelink transmission as shown in FIG. 9. Therefore, we can summary two major problems for inter-band con-current V2X operation to define new V2X band combinations.

FIG. 9 Illustrates Harmonic/IMD Problems for Inter-Band Con-Current V2X Operation.

Hereinafter, when the terminal transmits the uplink signal through two uplink carriers in an aggregation situation in which a plurality of downlink carriers and two uplink carriers are aggregated, it is analyzed whether interference leaks to the downlink band of the terminal and thereafter, a solution for the leakage is presented.

In more detail, as shown in FIG. 9, presented is a scheme for preventing receiving sensitivity from being decreased as the generated harmonics component flow into the Band 47 downlink frequency of the terminal when the terminal transmits the uplink signal of licensed band.

This invention describes a case where two downlink carriers are connected, but the present invention is not limited thereto. That is, the number of downlink carriers that can be transmitted to the terminal may be more than two. Similarly, this invention describes a case where two uplink carriers are connected, but the present invention is not limited thereto. That is, the number of uplink carriers that can be transmitted by the terminal may be more than two.

The scheme will be described below in detail.

Table 3 shows the proposed new V2X band combination.

TABLE 3

E-UTRA CA configuration/Bandwidth combination set

| V2X inter-band Configuration | E-UTRA operating Band | 1.4 MHz | 3 MHz | 5 MHz | 10 MHz | 15 MHz | 20 MHz | Maximum aggregated bandwidth [MHz] | Bandwidth combination set |
|---|---|---|---|---|---|---|---|---|---|
| V2X_20A-47A | 20 | | | Yes | Yes | Yes | Yes | [40] | 0 |
| | 47 | | | | Yes | | [Yes] | | |
| V2X_1A-47A | 1 | | | Yes | Yes | Yes | Yes | 40 | 0 |
| | 47 | | | | Yes | | Yes | | |
| V2X_5A-47A | 5 | Yes | Yes | Yes | | | | 30 | 0 |
| | 47 | | | | Yes | | Yes | | |

TABLE 3-continued

E-UTRA CA configuration/Bandwidth combination set

| V2X inter-band Configuration | E-UTRA operating Band | 1.4 MHz | 3 MHz | 5 MHz | 10 MHz | 15 MHz | 20 MHz | Maximum aggregated bandwidth [MHz] | Bandwidth combination set |
|---|---|---|---|---|---|---|---|---|---|
| V2X__34A-47A | 34 | | | Yes | Yes | Yes | | 35 | 0 |
| | 47 | | | | Yes | | Yes | | |

Coexistence Studies for V2X_20A-47A.

Table 3 shows Harmonics analysis for V2X_20A-47A and Table 4 shows harmonic analysis for V2X_20A-47A.

For own reception desensitization by dual transmission on V2X_20A-47A, RAN4 study up to 8th order harmonics and 2nd, 3rd, 4th and 5th order intermodulation products were calculated and presented in Table 4 and 5.

TABLE 4

| UE UL carriers | fx_low | fx_high | fy_low | fy_high |
|---|---|---|---|---|
| UL frequency (MHz) | 832 | 862 | 5855 | 5925 |
| $2^{nd}$ harmonics frequency limits | $2*fx\_low$ | $2*fx\_high$ | $2*fy\_low$ | $2*fy\_high$ |
| $2^{nd}$ harmonics frequency limits (MHz) | 1664 | 1724 | 11710 | 11850 |
| $3^{rd}$ harmonics frequency limits | $3*fx\_low$ | $3*fx\_high$ | $3*fy\_low$ | $3*fy\_high$ |
| $3^{rd}$ harmonics frequency limits (MHz) | 2496 | 2586 | 17565 | 17775 |
| $4^{th}$ harmonics frequency limits | $4*fx\_low$ | $4*fx\_high$ | $4*fy\_low$ | $4*fy\_high$ |
| $4t^{h}$ harmonics frequency limits (MHz) | 3328 | 3448 | 23420 | 23700 |
| $5^{th}$ harmonics frequency limits | $5*fx\_low$ | $5*fx\_high$ | $5*fy\_low$ | $5*fy\_high$ |
| $5^{th}$ harmonics frequency limits (MHz) | 4160 | 4310 | 29275 | 29625 |
| $6^{th}$ harmonics frequency limits | $6*fx\_low$ | $6*fx\_high$ | $6*fy\_low$ | $6*fy\_high$ |
| $6^{th}$ harmonics frequency limits (MHz) | 4992 | 5172 | 35130 | 35550 |
| $7^{th}$ harmonics frequency limits | $7*fx\_low$ | $7*fx\_high$ | $7*fy\_low$ | $7*fy\_high$ |
| $7^{th}$ harmonics frequency limits (MHz) | 5824 | 6034 | 40985 | 41475 |
| $8^{th}$ harmonics frequency limits | $8*fx\_low$ | $8*fx\_high$ | $8*fy\_low$ | $8*fy\_high$ |
| $8^{th}$ harmonics frequency limits (MHz) | 6656 | 6896 | 46840 | 47400 |

TABLE 5

| UE UL carriers | fx_low | fx_high | fy_low | fy_high |
|---|---|---|---|---|
| UL frequency (MHz) | 832 | 862 | 5855 | 5925 |
| $2^{nd}$ harmonics frequency limits | $2*fx\_low$ | $2*fx\_high$ | $2*fy\_low$ | $2*fy\_high$ |
| $2^{nd}$ harmonics frequency limits (MHz) | 1664 | 1724 | 11710 | 11850 |
| $3^{rd}$ harmonics frequency limits | $3*fx\_low$ | $3*fx\_high$ | $3*fy\_low$ | $3*fy\_high$ |
| $3^{rd}$ harmonics frequency limits (MHz) | 2496 | 2586 | 17565 | 17775 |
| Two tone $2^{nd}$ order IMD products IMD frequency limits | \|fy_low − fx_high\| | \|fy_high − fx_low\| | \|fy_low + fx_low\| | \|fy_high + fx_high\| |
| IMD frequency limits (MHz) | 4993 | 5093 | 6687 | 6787 |
| Two-tone $3^{rd}$ order IMD products IMD frequency limits | \|2*fx_low − fy_high\| | \|2*fx_high − fy_low\| | \|2*fy_low − fx_high\| | \|2*fy_high − fx_low\| |
| IMD frequency limits (MHz) | 4261 | 4131 | 10848 | 11018 |
| Two-tone $3^{rd}$ order IMD products IMD frequency limits | \|2*fx_low + fy_low\| | \|2*fx_high + fy_high\| | \|2*fy_low + fx_low\| | \|2*fy_high + fx_high\| |
| IMD frequency limits (MHz) | 7519 | 7649 | 12542 | 12712 |
| Two-tone $4^{th}$ order IMD products IMD frequency limits | \|3*fx_low − fy_high\| | \|3*fx_high − fy_low\| | \|3*fy_low − fx_high\| | \|3*fy_high − fx_low\| |
| IMD frequency limits (MHz) | 3429 | 3269 | 16703 | 16943 |
| Two-tone $4^{th}$ order IMD products IMD frequency limits | \|3*fx_low + fy_low\| | \|3*fx_high + fy_high\| | \|3*fy_low + fx_low\| | \|3*fy_high + fx_high\| |
| IMD frequency limits (MHz) | 8351 | 8511 | 18397 | 18637 |

TABLE 5-continued

| UE UL carriers | fx_low | fx_high | fy_low | fy_high |
|---|---|---|---|---|
| Two-tone 4$^{th}$ order IMD products IMD frequency limits (MHz) | \|2*fx_low − 2*fy_high\| 10186 | \|2*fx_high − 2*fy_low\| 9986 | \|2*fx_low + 2*fy_low\| 13374 | \|2*fx_high + 2*fy_high\| 13574 |
| Two-tone 5$^{th}$ order IMD products IMD frequency limits (MHz) | \|fx_low − 4*fy_high\| 22868 | \|fx_high − 4*fy_low\| 22558 | \|fy_low − 4*fx_high\| 2407 | \|fy_high − 4*fx_low\| 2597 |
| Two-tone 5$^{th}$ order IMD products IMD frequency limits (MHz) | \|fx_low + 4*fy_low\| 24252 | \|fx_high + 4*fy_high\| 24562 | \|fy_low + 4*fx_low\| 9183 | \|fy_high + 4*fx_high\| 9373 |
| Two-tone 5$^{th}$ order IMD products IMD frequency limits (MHz) | \|2*fx_low − 3*fy_high\| 16111 | \|2*fx_high − 3*fy_low\| 15841 | \|2*fy_low − 3*fx_high\| 9124 | \|2*fy_high − 3*fx_low\| 9354 |
| Two-tone 5$^{th}$ order IMD products IMD frequency limits (MHz) | \|2*fx_low + 3*fy_low\| 19229 | \|2*fx_high + 3*fy_high\| 19499 | \|2*fy_low + 3*fx_low\| 14206 | \|2*fy_high + 3*fx_high\| 14436 |

When V2X inter-band con-current operating UE is operating with other systems such as WiFi, Bluetooth and GNSS system, the harmonics and intermodulation products can have impact on these systems. Table 6 lists if up to 3$^{rd}$ order harmonics and IMD up to 5$^{th}$ order falls into one of these receiving bands.

TABLE 6

Harmonic and IMDs analysis of V2X_20A-47A UE for ISM and GNSS bands

| Victim Systems | Frequency range [MHz] | Impact | Regions | Comments |
|---|---|---|---|---|
| COMPASS (Beidou) | 1559-1591 | No | | |
| Galileo | 1559-1591 | No | | |
| GLONASS | 1591-1610 | No | | |
| GPS | 1563-1587 | No | | |
| ISM band (2.4 GHz) | 2400-2483.5 | Yes | US/Europe | IMD5 |
| | 2400-2494 | Yes | Asia | IMD5 |
| ISM band (5 GHz) | 5150-5925 | Yes | US | 7$^{th}$ Harmonics |
| | 5150-5350 | No | Europe | |
| | 5470-5725 | No | | |
| | 5150-5825 | Yes | Asia | 7$^{th}$ Harmonics |

Based on the harmonics/IMD analysis tables, the 7th harmonics product will be impact to the own reception of V2X_20A-47A UE. This impact will be studied to solve the self-interference problems.

The impact on ISM band at 2.4 GHz was already covered in 2DL/2UL CA WI in rel-12 which was solved by in-device coexistence solution such as TDM or FDM operation between dual uplink in licensed band and reception in unlicensed band.

Coexistence Studies for V2X_1A-47A

For own reception desensitization by dual transmission on V2X_1A-47A, RAN4 study up to 8th order harmonics and 2nd, 3rd, 4th and 5th order intermodulation products were calculated and presented in Table 7 and 8.

TABLE 7

Harmonics analysis for V2X_1A-47A

| UE UL carriers | fx_low | fx_high | fy_low | fy_high |
|---|---|---|---|---|
| UL frequency (MHz) | 1920 | 1980 | 5855 | 5925 |
| 2$^{nd}$ harmonics frequency limits | 2*fx_low | 2*fx_high | 2*fy_low | 2*fy_high |
| 2$^{nd}$ harmonics frequency limits (MHz) | 3840 | 3960 | 11710 | 11850 |
| 3$^{rd}$ harmonics frequency limits | 3*fx_low | 3*fx_high | 3*fy_low | 3*fy_high |
| 3$^{rd}$ harmonics frequency limits | 5760 | 5940 | 17565 | 17775 |
| 4th harmonics frequency limits | 4*fx_low | 4*fx_high | 4*fy_low | 4*fy_high |
| 4th harmonics frequency limits (MHz) | 7680 | 7920 | 23420 | 23700 |
| 5th harmonics frequency limits | 5*fx_low | 5*fx_high | 5*fy_low | 5*fy_high |
| 5th harmonics frequency limits (MHz) | 9600 | 9900 | 29275 | 29625 |
| 6th harmonics frequency limits | 6*fx_low | 6*fx_high | 6*fy_low | 6*fy_high |
| 6th harmonics frequency limits (MHz) | 11520 | 11880 | 35130 | 35550 |
| 7th harmonics frequency limits | 7*fx_low | 7*fx_high | 7*fy_low | 7*fy_high |
| 7th harmonics frequency limits (MHz) | 13440 | 13860 | 40985 | 41475 |
| 8th harmonics frequency limits | 8*fx_low | 8*fx_high | 8*fy_low | 8*fy_high |
| 8th harmonics frequency limits (MHz) | 15360 | 15840 | 46840 | 47400 |

TABLE 8

IMDs analysis for V2X_1A-47A

| UE UL carriers | fx_low | fx_high | fy_low | fy_high |
|---|---|---|---|---|
| UL frequency (MHz) | 1920 | 1980 | 5855 | 5925 |
| Two tone $2^{nd}$ order IMD products | \|fy_low − fx_high\| | \|fy_high − fx_low\| | \|fy_low + fx_low\| | \|fy_high + fx_high\| |
| IMD frequency limits (MHz) | 3875 | 4005 | 7775 | 7905 |
| Two-tone $3^{rd}$ order IMD products | \|2*fx_low − fy_high\| | \|2*fx_high − fy_low\| | \|2*fy_low − fx_high\| | \|2*fy_high − fx_low\| |
| IMD frequency limits (MHz) | 2085 | 1895 | 9730 | 9930 |
| Two-tone $3^{rd}$ order IMD products | \|2*fx_low + fy_low\| | \|2*fx_high + fy_high\| | \|2*fy_low + fx_low\| | \|2*fy_high + fx_high\| |
| IMD frequency limits (MHz) | 9695 | 9885 | 13630 | 13830 |
| Two-tone $4^{th}$ order IMD products | \|3*fx_low − fy_high\| | \|3*fx_high − fy_low\| | \|3*fy_low − fx_high\| | \|3*fy_high − fx_low\| |
| IMD frequency limits (MHz) | 165 | 85 | 15585 | 15855 |
| Two-tone $4^{th}$ order IMD products | \|3*fx_low + fy_low\| | \|3*fx_high + fy_high\| | \|3*fy_low + fx_low\| | \|3*fy_high + fx_high\| |
| IMD frequency limits (MHz) | 11615 | 11865 | 19485 | 19755 |
| Two-tone $4^{th}$ order IMD products | \|2*fx_low − 2*fy_high\| | \|2*fx_high − 2*fy_low\| | \|2*fx_low − 2*fy_low\| | \|2*fx_high + 2*fy_high\| |
| IMD frequency limits (MHz) | 8010 | 7750 | 15550 | 15810 |
| Two-tone $5^{th}$ order IMD products | \|fx_low − 4*fy_high\| | \|fx_high − 4*fy_low\| | \|fy_low − 4*fx_high\| | \|fy_high − 4*fx_low\| |
| IMD frequency limits (MHz) | 21780 | 21440 | 2065 | 1755 |
| Two-tone $5^{th}$ order IMD products | \|fx_low + 4*fy_low\| | \|fx_high + 4*fy_high\| | \|fy_low + 4*fx_low\| | \|fy_high + 4*fx_high\| |
| IMD frequency limits (MHz) | 25340 | 25680 | 13535 | 13845 |
| Two-tone $5^{th}$ order IMD products | \|2*fx_low − 3*fy_high\| | \|2*fx_high − 3*fy_low\| | \|2*fy_low − 3*fx_high\| | \|2*fy_high − 3*fx_low\| |
| IMD frequency limits (MHz) | 13935 | 13605 | 5770 | 6090 |
| Two-tone $5^{th}$ order IMD products | \|2*fx_low + 3*fy_low\| | \|2*fx_high + 3*fy_high\| | \|2*fy_low + 3*fx_low\| | \|2*fy_high + 3*fx_high\| |
| IMD frequency limits (MHz) | 21405 | 21735 | 17470 | 17790 |

When V2X inter-band con-current operating UE is operating with other systems such as WiFi, Bluetooth and GNSS system, the harmonics and intermodulation products can have impact on these systems. Table 8 lists if up to 8rd order harmonics and IMD up to 5th order falls into one of these receiving bands.

TABLE 9

Harmonic and IMDs analysis of V2X_1A-47A UE for ISM and GNSS bands

| Victim Systems | Frequency range [MHz] | Impact | Regions | Comments |
|---|---|---|---|---|
| COMPASS (Beidou) | 1559-1591 | No | | |
| Galileo | 1559-1591 | No | | |
| GLONASS | 1591-1610 | No | | |
| GPS | 1563-1587 | No | | |
| ISM band (2.4 GHz) | 2400-2483.5 | No | US/Europe | |
| | 2400-2494 | No | Asia | |
| ISM band (5 GHz) | 5150-5925 | Yes | US | $3^{rd}$ Harmonics, IMD5 |
| | 5150-5350 | No | Europe | |
| | 5470-5725 | No | | |
| | 5150-5825 | Yes | Asia | $3^{rd}$ Harmonics, IMD5 |

Based on the harmonics/IMD analysis tables, the 3rd harmonics product and 5th IMD will be impact to the own reception of V2X_1A-47A UE. But the 5th IMD do not occurred simultaneously between B47 transmission and reception. So IMD5 do not any impact as shown in above issue 2. The 3rd harmonic impact will be studied to solve the self-interference problems.

The impact on ISM band at 2.4 GHz was already covered in 2DL/2UL CA WI in rel-12 which was solved by in-device coexistence solution such as TDM or FDM operation between dual uplink in licensed band and reception in unlicensed band.

For V2X inter-band con-current operation for V2X_20-47, it is necessary to decide whether or not use the harmonic trap filter for $\Delta T_{IB}$ and $\Delta R_{IB}$.

TABLE 10

| $\Delta T_{IB, c}$ | | |
|---|---|---|
| Inter-band CA Configuration | E-UTRA Band | $\Delta T_{IB, c}$ [dB] |
| V2X_20-47 | 20 | 0.2 |

TABLE 11

| Inter-band CA Configuration | E-UTRA Band | $\Delta R_{IB,c}$ [dB] |
|---|---|---|
| V2X_20-47 | 20 | 0.2 |

<Candidate Solution for Harmonics/IMD Problem for V2X Service>

For the new V2X band combination V2X_20A-47A, we derived the required MSD level for Band 47 by 7th harmonic from Band 20 transmission.

Figure 10:
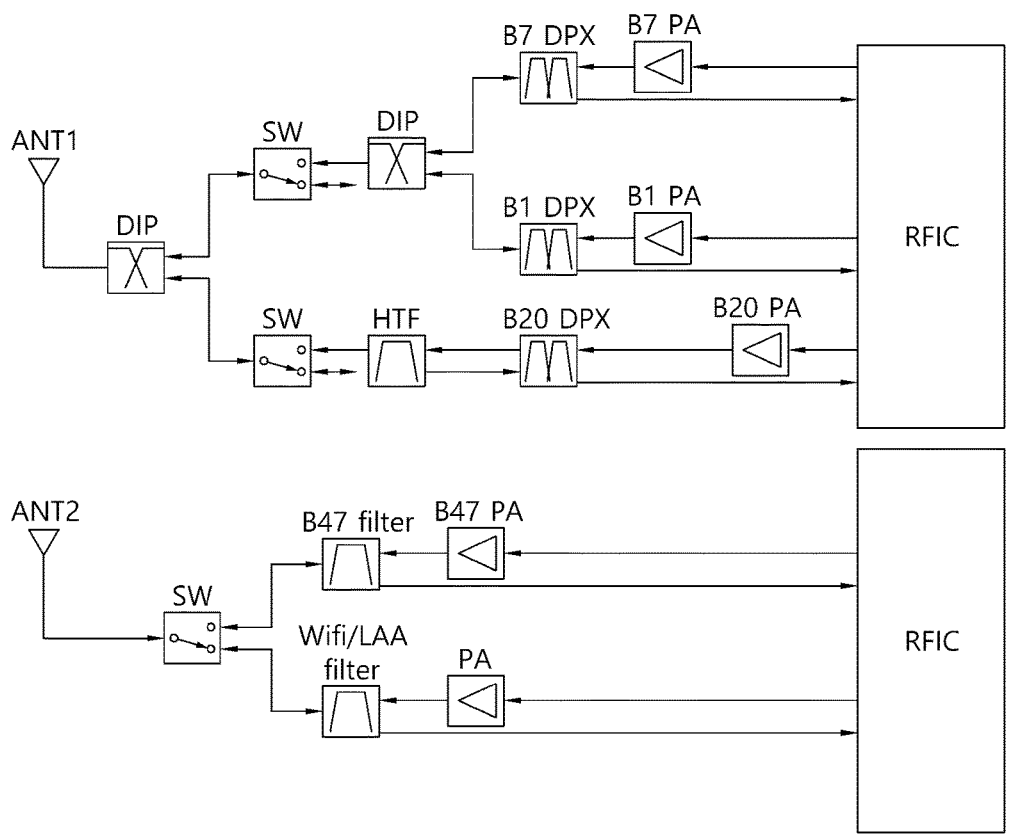
FIG. 10 illustrates Example RF architecture for V2X_20A-47A con-current operation with harmonic trap filter.

The basic UE RF architecture in FIG. 10 and harmonic trap filter are considered to analyze the de-sense level in Band 47.

Table 12 is the common isolation assumption for the V2X UE FE components.

TABLE 12

| V2X_20A-47A UE RF FE component isolation parameters | |
|---|---|
| | Attenuation Value |
| B20 Tx in PA output | 28 |
| B20 PA H7 attenuation | 69.8 |
| B20 duplexer H7 attenuation | 15 |
| Harmonic filter | 20 or 0 (w/or w/o) |
| LB switch H7 | 120 |
| Diplexer attenuation | 25 |
| Antenna isolation | 10 |
| Diplexer pathloss | 0.7 |
| UHB switch attenuation | 0.7 |
| UHB switch H7 | 130/110 (primary/secondary) |
| B47 Rx filter attenuation | 1.5 |
| B47 Rx filter H7 | 110/110 (primary/secondary) |
| B20 PA to B47 LNA isolation | 60 |

1. Solution1: Harmonics Problem on V2X20A-47A

The 7th harmonics of Band 20 is would interfere the reception of the Band 47. To analyze the self-desense level, we consider two option as below Option1: Separate Ant. Architecture w/ HTF Option2: Separate Ant. Architecture w/o HTF The example RF architecture for option1 on V2X_20A-47A UE is shown in FIG. 10.

The Table 13 is the common parameters for MSD analysis for V2X_20A-47A.

TABLE 13

| | Option1: W/HTF | | | | Option2: W/O HTF | | | |
|---|---|---|---|---|---|---|---|---|
| | Primary | | Diversity | | Primary | | Diversity | |
| Parameter | Value | H7 level | Value | H7 level | Value | H7 level | Value | H7 level |
| B20 Tx in PA output | 28 | | 28 | | 28 | | 28 | |
| B20 PA H7 attenuation | 69.8 | −41.8 | 69.8 | −41.8 | 69.8 | −41.8 | 69.8 | −41.8 |
| B20 duplexer H7 attenuation | 15 | −56.8 | 15 | −56.8 | 15 | −56.8 | 15 | −56.8 |
| Harmonic filter | 20 | −76.8 | 20 | −76.8 | 0 | −56.8 | 0 | −56.8 |
| LB switch H7 | −120 | −76.8 | −120 | −76.8 | −120 | −56.8 | −120 | −56.8 |
| Diplexer attenuation | 25 | −101.8 | 25 | −101.8 | 25 | −81.8 | 25 | −81.8 |
| Antenna isolation | 10 | −111.8 | 10 | −111.8 | 10 | −91.8 | 10 | −91.8 |
| Diplexer pathloss | 0.7 | −112.5 | 0.7 | −112.5 | 0.7 | −92.5 | 0.7 | −92.5 |
| UHB switch attenuation | 0.7 | −113.2 | 0.7 | −113.2 | 0.7 | −93.2 | 0.7 | −93.2 |
| UHB switch H7 | −130 | −113.1 | −110 | −108.3 | −130 | −93.2 | −110 | −93.1 |
| B47 Rx filter attenuation | 1.5 | −114.6 | 1.5 | −109.8 | 1.5 | −94.7 | 1.5 | −94.6 |
| B47 Rx filter H7 | −110 | −108.7 | −110 | −106.9 | −110 | −94.5 | −110 | −94.4 |
| B20 PA to B47 LNA isolation | 60 | −101.8 | 60 | −101.8 | 60 | −101.8 | 60 | −101.8 |
| Composite | | −101.0 | | −100.6 | | −93.8 | | −93.7 |

From the Table 13, MSD level for V2X_20A-47A is derived as below.

TABLE 14

Estimated MSD level at Band 47

|  | | W/HTF | | W/O HTF | |
| --- | --- | --- | --- | --- | --- |
|  | Thermal | H7 level (dBm) | MSD (dB) | H7 level (dBm) | MSD (dB) |
| Main Path | −101 | −101.0 | 3.08 | −93.8 | 8.06 |
| Diversity Path | −101 | −100.6 | 3.27 | −93.7 | 8.12 |
| After MRC |  |  | 0.16 |  | 5.08 |

From the estimated MSD level at Band 47 by 7th harmonics from Band 20 is about 0 dB when we consider the harmonics trap filter to mitigate the harmonics products.

Hence we propose as below to solve the harmonics problems into Band 47.

Proposal 1:

For V2X band combination with harmonics problems, RAN4 should consider the harmonics trap filter to mitigate the harmonic products into Band 47 and protect safety message.

2. Solution1: Harmonics Problem on V2X_1A-47A

The $3^{rd}$ harmonics of Band 1 would interfere the reception of the Band 47. To analyse the self-desense level, we consider two option. One is W/ HTF case and the other is w/o HTF.

The Table 15 is the common parameters for MSD analysis for V2X_1A-47A.

From the Table 15, MSD level for V2X_1A-47A is derived as below Table 16.

TABLE 16

Estimated MSD level at Band 47 (V2X_1A-47A)

|  | | W/HTF | | W/O HTF | |
| --- | --- | --- | --- | --- | --- |
|  | Thermal | H3 level (dBm) | MSD (dB) | H3 level (dBm) | MSD (dB) |
| Main Path | −101 | −81.9 | 19.2 | −74.9 | 26.2 |
| Diversity Path | −101 | −81.9 | 19.2 | −74.9 | 26.2 |
| After MRC |  |  | 16.2 |  | 23.2 |

Based on the analysis results, we can see that the dominant factor to decide the MSD level for V2X_1A-47 is B1 PA attenuation level to protect Band 47 and PCB isolation level (PA to B47 LNA).

If PA vendor consider Band 47 as LTE protection band, the B1 PA attenuation level will be improved, and also the UE vendor should be improved the PCB isolation level by considering state-of-art technology. Then the required MSD level can be achieved as 0 dB for V2X_1A-47A UE as below Table 17.

TABLE 15

V2X_1A-47A UE RF FE component isolation parameters

|  | Option1: W/HTF | | | | Option2: W/O HTF | | | |
| --- | --- | --- | --- | --- | --- | --- | --- | --- |
|  | Primary | | Diversity | | Primary | | Diversity | |
| Parameter | Value | H3 level | Value | H3 level | Value | H3 level | Value | H3 level |
| B1 Tx in PA output | 28 |  | 28 |  | 28 |  | 28 |  |
| B1 PA H3 attenuation | 50 | −22 | 50 | −22 | 50 | −22 | 50 | −22 |
| B1 duplexer H3 attenuation | 16 | −38 | 16 | −38 | 16 | −38 | 16 | −38 |
| Harmonic filter | 25 | −63 | 25 | −63 | 0 | −38 | 0 | −38 |
| Midband switch H3 | −65 | −60.9 | −65 | −60.9 | −65 | −38 | −65 | −38 |
| Diplexer attenuation | 25 | −85.9 | 25 | −85.9 | 25 | −63 | 25 | −63 |
| Antenna isolation | 10 | −95.9 | 10 | −95.9 | 10 | −73 | 10 | −73 |
| Diplexer pathloss | 0.7 | −96.6 | 0.7 | −96.6 | 0.7 | −73.7 | 0.7 | −73.7 |
| UHB switch attenuation | 0.7 | −97.3 | 0.7 | −97.3 | 0.7 | −74.4 | 0.7 | −74.4 |
| UHB switch H3 | −130 | −97.3 | −110 | −97.0 | −130 | −74.4 | −110 | −74.4 |
| B47 Rx filter attenuation | 1.5 | −98.8 | 1.5 | −98.5 | 1.5 | −75.9 | 1.5 | −75.9 |
| B47 Rx filter H3 | −110 | −98.5 | −110 | −98.2 | −110 | −75.9 | −110 | −75.9 |
| B1 PA to B47 LNA isolation | 60 | −82.0 | 60 | −82.0 | 60 | −82.0 | 60 | −82.0 |
| Composite |  | −81.9 |  | −81.9 |  | −74.9 |  | −74.9 |

TABLE 17

V2X_1A-47A UE RF FE component isolation parameters

| | Option1: W/HTF | | | | Option2: W/O HTF | | | |
|---|---|---|---|---|---|---|---|---|
| | Primary | | Diversity | | Primary | | Diversity | |
| Parameter | Value | H3 level | Value | H3 level | Value | H3 level | Value | H3 level |
| B1 Tx in PA output | 28 | | 28 | | 28 | | 28 | |
| B1 PA H3 attenuation | 50 → 65 | −37 | 50 → 65 | −37 | 50 → 65 | −37 | 50 → 65 | −37 |
| B1 duplexer H3 attenuation | 16 | −53 | 16 | −53 | 16 | −53 | 16 | −53 |
| Harmonic filter | 25 | −78 | 25 | −78 | 0 | −53 | 0 | −53 |
| Midband switch H3 | −65 | −64.8 | −65 | −64.8 | −65 | −52.7 | −65 | −52.7 |
| Diplexer attenuation | 25 | −89.8 | 25 | −89.8 | 25 | −77.7 | 25 | −77.7 |
| Antenna isolation | 10 | −99.8 | 10 | −99.8 | 10 | −87.7 | 10 | −87.7 |
| Diplexer pathloss | 0.7 | −100.5 | 0.7 | −100.5 | 0.7 | −88.4 | 0.7 | −88.4 |
| UHB switch attenuation | 0.7 | −101.2 | 0.7 | −101.2 | 0.7 | −89.1 | 0.7 | −89.1 |
| UHB switch H3 | −130 | −101.2 | −110 | −100.7 | −130 | −89.1 | −110 | −89.1 |
| B47 Rx filter attenuation | 1.5 | −102.7 | 1.5 | −102.2 | 1.5 | −90.6 | 1.5 | −90.6 |
| B47 Rx filter H3 | −110 | −101.9 | −110 | −101.5 | −110 | −90.6 | −110 | −90.6 |
| B1 PA to B47 LNA isolation | 60 → 70 | −107.0 | 60 → 70 | −107.0 | 60 → 70 | −107.0 | 60 → 70 | −107.0 |
| Composite | | −100.8 | | −100.4 | | −90.5 | | −90.5 |

From the Table 17, MSD level for V2X_1A-47A is derived as below Table 18.

TABLE 18

Estimated MSD level at Band 47

| | | W/HTF | | W/O HTF | |
|---|---|---|---|---|---|
| | Thermal | H3 level (dBm) | MSD (dB) | H3 level (dBm) | MSD (dB) |
| Main Path | −101 | −100.8 | 3.18 | −90.5 | 10.98 |
| Diversity Path | −101 | −100.4 | 3.37 | −90.5 | 11.01 |
| After MRC | | | 0.26 | | 7.98 |

The estimated MSD level at Band 47 by $3^{rd}$ harmonics from Band 1 is about 0.3 dB when we consider the harmonics trap filter, improving B1 PA attenuation level and advanced implementation skill to increase PCB isolation level.

So RAN4 recommend when V2X band combination has low-order harmonic problem, UE vendor could consider state-of-art technology to increase the Band 1 PA attenuation level at the frequency range of Band 47. Also need to get the tight PCB isolation by implementation. Then RAN4 define 0 dB MSD in Band 47 for V2X inter-band concurrent operation UE with low-order harmonic problem.

However, this approach is quite difficult to apply all phone type UE in current state-of-art technology status. So the alternative solution is that 0 dB MSD would be guaranteed when V2X UE transmit the V2X message within 1920-1950 MHz frequency range since $3^{rd}$ harmonic products do not fall into the own Band 47 band. However, V2X UE send a message in 1950~1975 MHz, then the received signal in Band 47 would be desensitized by generated 3rd harmonic products. So RAN4 should define A-MPR requirements to protect V2X safety messages in Band 47.

Hence we propose as below to solve the harmonics problems into Band 47.

Proposal 2: If the MSD level is not guarantee 0 dB for V2X band combination even if use harmonic trap filter, RAN4 can define A-MPR requirements in licensed band. Also the required MSD can be defined for Band 47.

Proposal 2-1: If the MSD level is not guarantee 0 dB for V2X band combination even if use harmonic trap filter, RAN4 shall define two minimum requirement. One is to guarantee 0 dB MSD in a certain TX frequency band since the generated harmonics products will not impacted to receive the V2X safety message in Band 47. The other is defining of the A-MPR requirements to protect the safety message in the harmonic range.

Proposal 2-2: If the MSD level is not guarantee 0 dB for V2X band combination even if use harmonic trap filter, MSD for Band 47 also one candidate solution, but the Vehicle-to-Vehicle coverage is quite less than w/o harmonic case.

Proposal 3: In network coverage, network scheduler can be solved this problems by implementation.

The A-MPR requirement will be studied when the related V2X band combination is proposed to support V2X service. However, RAN4 should guarantee 0 dB MSD for all V2X con-current operation UE to protect safety message in Band 47 by improving the related PA attenuation level to protect Band 47 and advanced implementation skill to increase PCB isolation level in near future.

3. Solution2: IMD Problems on Licensed Band

This IMD problem into the own receiving Band XX can be raised by dual transmission from the V2X 21A-47A UE and V2X_47A-65A UE in Table1.

The problems on the own licensed Band is quite similar to inter-band CA combination. So this IMD problem can be easily solved by following dual uplink CA band combination.

In dual uplink CA, RAN4 define MSD requirements to allow sensitivity degradation in own receiving frequency band at licensed band.

Hence, we propose as below to solve the IMD problems into licensed Rx Band.

Proposal 4: For V2X band combination with IMD problems by dual transmission, RAN4 define MSD level to allow sensitivity degradation in own receiving frequency band.

<For Using V2X_5A-47A in LTE Based Celluar-V2X System>

Meanwhile, from now, the present invention proposes additional degree of sensitivity reduction and standard ILs through HTF through the terminal characteristics analysis when V2X_5A-47A is used in LTE based cellular-V2X.

In rel-15, V2X_5A-47A and V2X_34A-47A are currently proposed, and their own Rx impact on own transmission is analyzed through coexistence analysis.

Concurrent operation of additional LTE Uu frequency bands and PC5 operation on Band 47

Highest priority, and target for RAN#76 completion, shall be given to the following combination:

| V2X MCC Band | V2X Band | Channel bandwidths | Interface |
|---|---|---|---|
| V2X_20_47 | 20 | 5, 10, 15, 20 | Uu |
|  | 47 | 10, [20] | PC5 |

Other LTE Uu frequency bands are not precluded. For the target completion date, RAN4 should guaranteed the minimum two RAN4 WG meeting from the starting for new band combinations.

Concurrent operation of LTE Uu Carrier Aggregation and PC5 operation on Band 47. Proposed combinations to be proposed during the work item in line with the CA basket WID approach.

Based on agreed work plan (R4-1703287), the total number of carriers of LTE Uu CA and PC5 operation is restricted up to 3CCs in this WI.

E.g. CA_XA-YA (Uu)+47A (PC5) or XA (Uu)+47B (PC5)

In this paper, we provide our REFSEN requirements by the self-interference problems of new V2X band combinations.

TABLE 19

Inter-band con-current V2X operating bands for V2X_5A-47A

| V2X con-current configuration | E-UTRA Operating Band | Interface | Uplink (UL) band BS receive/UE transmit $F_{UL\_low}$-$F_{UL\_high}$ | Downlink (DL) band BS transmit/UE receive $F_{DL\_low}$-$F_{DL\_high}$ | Duplex Mode |
|---|---|---|---|---|---|
| V2X_5-47 | 5 | Uu | 824 MHz-849 MHz | 869 MHz-894 MHz | FDD |
|  | 47 | PC5 | 5855 MHz-5925 MHz | 5855 MHz-5925 MHz | HD |

TABLE 20

V2X inter-band con-current configurations and bandwidth combination sets for V2X_5A-47A
E-UTRA CA configuration/Bandwidth combination set

| V2X inter-band Configuration | E-UTRA operating Band | 1.4 MHz | 3 MHz | 5 MHz | 10 MHz | 15 MHz | 20 MHz | Maximum aggregated bandwidth [MHz] | Bandwidth combination set |
|---|---|---|---|---|---|---|---|---|---|
| V2X_5A-47A | 5 |  |  | Yes | Yes |  |  | 30 | 0 |
|  | 47 |  |  |  | Yes |  | Yes |  |  |

For own reception desensitization by dual transmission on V2X_5A-47A, RAN4 study up to 8th order harmonics and 2nd, 3rd, 4th and 5th order intermodulation products were calculated and presented in Table 21 and Table 22.

TABLE 21

Harmonics analysis for V2X_5A-47A

| UE UL carriers | fx_low | fx_high | fy_low | fy_high |
|---|---|---|---|---|
| UL frequency (MHz) | 824 | 849 | 5855 | 5925 |
| 2$^{nd}$ harmonics frequency limits | 2*fx_low | 2*fx_high | 2* fy_low | 2* fy_high |
| 2$^{nd}$ harmonics frequency limits (MHz) | 1648 | 1698 | 11710 | 11850 |
| 3$^{rd}$ harmonics frequency limits | 3*fx_low | 3*fx_high | 3* fy_low | 3* fy_high |
| 3$^{rd}$ harmonics frequency limits (MHz) | 2472 | 2547 | 17565 | 17775 |
| 4$^{th}$ harmonics frequency limits | 4*fx_low | 4*fx_high | 4* fy_low | 4* fy_high |
| 4t$^{h}$ harmonics frequency limits (MHz) | 3296 | 3396 | 23420 | 23700 |
| 5$^{th}$ harmonics frequency limits | 5*fx_low | 5*fx_high | 5* fy_low | 5* fy_high |
| 5$^{th}$ harmonics frequency limits (MHz) | 4120 | 4245 | 29275 | 29625 |
| 6$^{th}$ harmonics frequency limits | 6*fx_low | 6*fx_high | 6* fy_low | 6* fy_high |
| 6$^{th}$ harmonics frequency limits (MHz) | 4944 | 5094 | 35130 | 35550 |
| 7$^{th}$ harmonics frequency limits | 7*fx_low | 7*fx_high | 7* fy_low | 7* fy_high |
| 7$^{th}$ harmonics frequency limits (MHz) | 5768 | 5943 | 40985 | 41475 |
| 8$^{th}$ harmonics frequency limits | 8*fx_low | 8*fx_high | 8* fy_low | 8* fy_high |
| 8$^{th}$ harmonics frequency limits (MHz) | 6592 | 6792 | 46840 | 47400 |

TABLE 22

IMD analysis for V2X_5A-47A

| UE UL carriers | fx_low | fx_high | fy_low | fy_high |
|---|---|---|---|---|
| UL frequency (MHz) | 824 | 849 | 5855 | 5925 |
| Two tone 2$^{nd}$ order IMD products | \|fy_low − fx_high\| | \|fy_high − fx_low\| | \|fy_low + fx_low\| | \|fy_high + fx_high\| |
| IMD frequency limits (MHz) | 5006 | 5101 | 6679 | 6774 |
| Two-tone 3$^{rd}$ order IMD products | \|2*fx_low − fy_high\| | \|2*fx_high − fy_low\| | \|2*fy_low − fx_high\| | \|2*fy_high − fx_low\| |
| IMD frequency limits (MHz) | 4277 | 4157 | 10861 | 11026 |
| Two-tone 3$^{rd}$ order IMD products | \|2*fx_low + fy_low\| | \|2*fx_high + fy_high\| | \|2*fy_low + fx_low\| | \|2*fy_high + fx_high\| |
| IMD frequency limits (MHz) | 7503 | 7623 | 12534 | 12699 |
| Two-tone 4$^{th}$ order IMD products | \|3*fx_low − fy_high\| | \|3*fx_high − fy_low\| | \|3*fy_low − fx_high\| | \|3*fy_high − fx_low\| |
| IMD frequency limits (MHz) | 3453 | 3308 | 16716 | 16951 |
| Two-tone 4$^{th}$ order IMD products | \|3*fx_low + fy_low\| | \|3*fx_high + fy_high\| | \|3*fy_low + fx_low\| | \|3*fy_high + fx_high\| |
| IMD frequency limits (MHz) | 8327 | 8472 | 18389 | 18624 |
| Two-tone 4$^{th}$ order IMD products | \|2*fx_low − 2*fy_high\| | \|2*fx_high − 2*fy_low\| | \|2*fx_low − 2*fy_low\| | \|2*fx_high + 2*fy_high\| |
| IMD frequency limits (MHz) | 10202 | 10012 | 10062 | 10152 |
| Two-tone 5$^{th}$ order IMD products | \|fx_low − 4*fy_high\| | \|fx_high − 4*fy_low\| | \|fy_low − 4*fx_high\| | \|fy_high − 4*fx_low\| |
| IMD frequency limits (MHz) | 22876 | 22571 | 2459 | 2629 |
| Two-tone 5$^{th}$ order IMD products | \|fx_low + 4*fy_low\| | \|fx_high + 4*fy_high\| | \|fy_low + 4*fx_low\| | \|fy_high + 4*fx_high\| |
| IMD frequency limits (MHz) | 24244 | 24549 | 9151 | 9321 |
| Two-tone 5$^{th}$ order IMD products | \|2*fx_low − 3*fy_high\| | \|2*fx_high − 3*fy_low\| | \|2*fy_low − 3*fx_high\| | \|2*fy_high − 3*fx_low\| |
| IMD frequency limits (MHz) | 16127 | 15867 | 9163 | 9378 |
| Two-tone 5$^{th}$ order IMD products | \|2*fx_low + 3*fy_low\| | \|2*fx_high + 3*fy_high\| | \|2*fy_low + 3*fx_low\| | \|2*fy_high + 3*fx_high\| |
| IMD frequency limits (MHz) | 19213 | 19473 | 14182 | 14397 |

When V2X inter-band con-current operating 15E is operating with other systems such as WiFi, Bluetooth and GNSS system, the harmonics and intermodulation products can have impact on these systems. Table 6.x.3-3 lists if up to 8th order harmonics and IMD up to 5th order falls into one of these receiving bands.

TABLE 23

Harmonic and IMDs analysis of V2X_5A-47A UE for ISM and GNSS bands

| Victim Systems | Frequency range [MHz] | Impact | Regions | Comments |
|---|---|---|---|---|
| COMPASS (Beidou) | 1559-1591 | No | | |
| Galileo | 1559-1591 | No | | |
| GLONASS | 1591-1610 | No | | |
| GPS | 1563-1587 | No | | |
| ISM band (2.4 GHz) | 2400-2483.5 | Yes | US/Europe | IMD5, 3$^{rd}$ harmonics from B5 |
| | 2400-2494 | Yes | Asia | IMD5, 3$^{rd}$ harmonics from B5 |
| ISM band (5 GHz) | 5150-5925 | Yes | US | 7$^{th}$ harmonics from B5 |
| | 5150-5350 | No | Europe | |
| | 5470-5725 | No | | |
| | 5150-5825 | Yes | Asia | 7$^{th}$ harmonics from B5 |

Based on the harmonics/IMD analysis tables, the 7th harmonics product will be impact to the own reception of V2X_5A-47A UE. This impact will be studied to solve the self-interference problems.

The impact on ISM band at 2.4 GHz and 5 GHz were already covered in 2DL/2UL CA WI in rel-12 which was solved by in-device coexistence solution such as TDM or FDM operation between dual uplink in licensed band and reception in unlicensed band.

Based on the commercial filter performance, the additional insertion loss of HTF is impacted to transmission and reception of Band 5.

TABLE 24

Harmonic Trap filter performance

| | ILs for Band 5 Transmission | ILs for Band 5 reception | Attenuation on B47 (dB) |
|---|---|---|---|
| Vendor A | 0.5 | 0.48 | 35 |
| Vendor B | 0.47 | 0.45 | 25 |

TABLE 24-continued

Harmonic Trap filter performance

| | ILs for Band 5 Transmission | ILs for Band 5 reception | Attenuation on B47 (dB) |
|---|---|---|---|
| Vendor C | 0.35 | 0.32 | 23 |
| Avg. Values | 0.44 | 0.42 | 28 |

As following shred pain approach in CA WI, we propose the additional ILs for V2X_5A-47A UE as below Table 25.

TABLE 25

Additional ILs for V2X_5A-47A UE

| Inter-band V2X con-current operation | $\Delta T_{IB,c}$ [dB] | $\Delta R_{IB,c}$ [dB] |
|---|---|---|
| V2X_5A-47A | 0.2 | 0.2 |

We propose additional ILs of V2X_5A-47A UE to imtegate self-interference problems by 7th order harmonics problems. The corresponding TP is proposed as below.

<MSD Analysis for V2X_5A-47A UE>

For the new V2X band combination V2X_5A-47A, we derived the required MSD level for Band 47 by 7th harmonic from Band 5 transmission.

The basic UE RF architecture in Figure1 and harmonic trap filter are considered to analyse the de-sense level in Band 47.

Table 26 is the common isolation assumption for the V2X UE FE components.

TABLE 26

V2X_5A-47A UE RF FE component isolation parameters

| | Attenuation Value |
|---|---|
| B5 Tx in PA output | 28 |
| B5 PA H7 attenuation | 69 |

TABLE 26-continued

V2X_5A-47A UE RF FE component isolation parameters

| | Attenuation Value |
|---|---|
| B5 duplexer H7 attenuation | 15 |
| Harmonic filter | 20 or 0 (w/or w/o) |
| LB switch H7 | 120 |
| Diplexer attenuation | 25 |
| Antenna isolation | 10 |
| Diplexer pathloss | 0.7 |
| UHB switch attenuation | 0.7 |
| UHB switch H7 | 130/110 (primary/secondary) |
| B47 Rx filter attenuation | 1.5 |
| B47 Rx filter H7 | 110/110 (primary/secondary) |
| B5 PA to B47 LNA isolation | 60 |

<Harmonic Problem on V2X_5A-47A>

The 7th harmonics of Band 5 is would interfere the reception of the Band 47. To analyze the self-desense level, we consider two option as below.

Option1: Separate Ant. Architecture w/ HTF

Option2: Separate Ant. Architecture w/o HTF

The Table 27 is the common parameters for MSD analysis for V2X_5A-47A.

TABLE 27

V2X_5A-47A UE RF FE component isolation parameters

| | Option1: W/HTF | | | | Option2: W/O HTF | | | |
|---|---|---|---|---|---|---|---|---|
| | Primary | | Diversity | | Primary | | Diversity | |
| Parameter | Value | H7 level | Value | H7 level | Value | H7 level | Value | H7 level |
| B5 Tx in PA output | 28 | | 28 | | 28 | | 28 | |
| B5 PA H7 attenuation | 69 | −41 | 68 | −41 | 69 | −41 | 69 | −41 |
| B5 duplexer H7 attenuation | 15 | −56 | 15 | −56 | 15 | −56 | 15 | −56 |
| Harmonic filter | 20 | −76 | 20 | −76 | 0 | −56 | 0 | −56 |
| LB switch H7 | −120 | −76 | −120 | −76 | −120 | −56 | −120 | −56 |
| Diplexer attenuation | 25 | −101 | 25 | −101 | 25 | −81 | 25 | −81 |
| Antenna isolation | 10 | −111 | 10 | −111 | 10 | −91 | 10 | −91 |
| Diplexer pathloss | 0.7 | −111.7 | 0.7 | −111.7 | 0.7 | −91.7 | 0.7 | −91.7 |
| UHB switch attenuation | 0.7 | −112.4 | 0.7 | −112.4 | 0.7 | −92.4 | 0.7 | −92.4 |
| UHB switch H7 | −130 | −112.3 | −110 | −108.0 | −130 | −92.4 | −110 | −92.3 |
| B47 Rx filter attenuation | 1.5 | −113.8 | 1.5 | −109.5 | 1.5 | −93.9 | 1.5 | −93.8 |
| B47 Rx filter H7 | −110 | −108.5 | −110 | −106.7 | −110 | −93.8 | −110 | −93.7 |
| B20 PA to B47 LNA isolation | 60 | −101.0 | 60 | −101.0 | 60 | −101.0 | 60 | −101.0 |
| Composite | | −100.3 | | −100.0 | | −93.0 | | −93.0 |

From the Table 27, MSD level for V2X_20A-47A is derived as below.

TABLE 28

Estimated MSD level at Band 47

| | | W/HTF | | W/O HTF | |
|---|---|---|---|---|---|
| | Thermal | H7 level (dBm) | MSD (dB) | H7 level (dBm) | MSD (dB) |
| Main Path | −101 | −100.3 | 3.44 | −93.0 | 8.69 |
| Diversity Path | −101 | −100.0 | 3.61 | −93.0 | 8.75 |
| After MRC | | | 0.51 | | 5.71 |

From the estimated MSD level at Band 47 by 7th harmonics from Band 5 is about 0 dB when we consider the harmonics trap filter to mitigate the harmonics products.

Hence, we provide our analysis results on V2X_5A-47A UE sensitivity level by self-interference problems. Based on the analysis, we propose TP as below.

Based on the MSD analysis, RAN4 recommend shall consider the harmonic trap filter to protect Band 47 for vehicle safety message.

TABLE 29

Proposed MSD values for V2X_5A-47A

| V2X con-current configuration | LGE | Company 2 | Company 3 | Avg. MSD [dB] |
|---|---|---|---|---|
| V2X_5A-47A | 0.51 | TBD | TBD | TBD |

Note 1:
For the V2X con-current configuration UE with harmonic problem into Band 47, harmonic trap filter should be considered to protect the V2X safety message in Band 47

The proposed MSD value is about 0.5 level, but this value varies depending on the characteristics of the device, so the MSD can be defined within a range of 0 to 1 dB.

Figure 11:
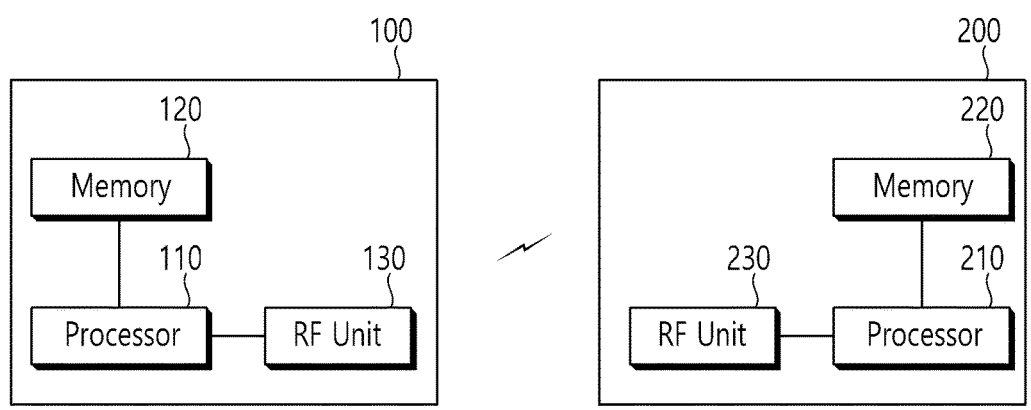
FIG. 11 is a block diagram illustrating a wireless communication system in which a disclosure of the present specification is implemented.

FIG. 11 is a Block Diagram Illustrating a Wireless Communication System in which a Disclosure of the Present Specification is Implemented.

The base station 200 includes a processor 210, a memory 220, and a radio frequency (RF) unit 230. The memory 220 is connected with the processor 210 to store various pieces of information for driving the processor 210. The RF unit 230 is connected with the processor 210 to transmit and/or receive a radio signal. The processor 210 implements a function, a process, and/or a method which are proposed. In the aforementioned embodiment, the operation of the base station may be implemented by the processor 210.

UE 100 includes a processor 110, a memory 120, and an RF unit 130. The memory 120 is connected with the processor 110 to store various pieces of information for driving the processor 110. The RF unit 130 is connected with the processor 110 to transmit and/or receive the radio signal. The processor 110 implements a function, a process, and/or a method which are proposed.

The processor may include an application-specific integrated circuit (ASIC), another chip set, a logic circuit and/or a data processing apparatus. The memory may include a read-only memory (ROM), a random access memory (RAM), a flash memory, a memory card, a storage medium, and/or other storage device. The RF unit may include a baseband circuit for processing the radio signal. When the embodiment is implemented by software, the aforementioned technique may be implemented by a module (a process, a function, and the like) that performs the aforementioned function. The module may be stored in the memory and executed by the processor. The memory may be positioned inside or outside the processor and connected with the processor by various well-known means.

In the aforementioned exemplary system, methods have been described based on flowcharts as a series of steps or blocks, but the methods are not limited to the order of the steps of the present invention and any step may occur in a step or an order different from or simultaneously as the aforementioned step or order. Further, it can be appreciated by those skilled in the art that steps shown in the flowcharts are not exclusive and other steps may be included or one or more steps do not influence the scope of the present invention and may be deleted.

What is claimed is:

1. A method for transmitting/receiving a signal by a terminal configured to aggregate a plurality of downlink carriers and two uplink carriers, the method comprising:
when the two uplink carriers include evolved universal terrestrial radio access (E-UTRA) operating bands 20 and 47 and the plurality of downlink carriers include E-UTRA operating band 47, receiving a downlink signal through the plurality of downlink carriers by using a value of maximum sensitivity degradation (MSD) for a reference sensitivity of the two uplink carriers,
wherein the value of the MSD is predetermined based on whether a harmonic trap filter for mitigating harmonic interference is used by the terminal,
wherein when the harmonic trap filter is used by the terminal for mitigating harmonic interference, the value of the MSD is 0.16 dB, and
wherein when the harmonic trap filter is not used by the terminal for mitigating harmonic interference, the value of the MSD is 5.08 dB.

2. A terminal configured to aggregate a plurality of downlink carriers and two uplink carriers for transmitting/receiving a signal, the terminal comprising:
a transceiver configured to:
transmit an uplink signal through the two uplink carriers, the two uplink carriers including evolved universal terrestrial radio access (E-UTRA) operating bands 20 and 47; and
receive a downlink signal through the plurality of downlink carriers by using a value of maximum sensitivity degradation (MSD) for a reference sensitivity of the two uplink carriers, the plurality of downlink carriers including E-UTRA operating band 47; and
a processor configured to control the transceiver,
wherein the value of the MSD is predetermined based on whether a harmonic trap filter for mitigating harmonic interference is used by the terminal,
wherein when the harmonic trap filter is used by the terminal for mitigating harmonic interference, the value of the MSD is 0.16 dB, and
wherein when the harmonic trap filter is not used by the terminal for mitigating harmonic interference, the value of the MSD is 5.08 dB.

3. A method for transmitting/receiving a signal by a terminal configured to aggregate a plurality of downlink carriers and two uplink carriers, the method comprising:
when the two uplink carriers include evolved universal terrestrial radio access (E-UTRA) operating bands 5 and 47 and the plurality of downlink carriers include E-UTRA operating band 47, receiving a downlink signal through the plurality of downlink carriers by using a value of maximum sensitivity degradation (MSD) for a reference sensitivity of the two uplink carriers,
wherein the value of the MSD is predetermined based on whether a harmonic trap filter for mitigating harmonic interference is used by the terminal,
wherein when the harmonic trap filter is used by the terminal for mitigating harmonic interference, the value of the MSD is 0.51 dB, and
wherein when the harmonic trap filter is not used by the terminal for mitigating harmonic interference, the value of the MSD is 5.71 dB.

4. The method of claim 3, wherein when harmonic trap filter is used by the terminal for mitigating harmonic interference, a range of the value of the MSD is between 0 and 1 dB.

* * * * *